United States Patent
Kim

(10) Patent No.: US 12,009,020 B2
(45) Date of Patent: *Jun. 11, 2024

(54) MEMORY DEVICE GENERATING OPTIMAL WRITE VOLTAGE BASED ON SIZE OF MEMORY CELL AND INITIAL WRITE VOLTAGE

(71) Applicant: SAMSUNG ELECTRONICS CO., LTD., Suwon-si (KR)

(72) Inventor: Daeshik Kim, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 238 days.

This patent is subject to a terminal disclaimer.

(21) Appl. No.: 17/707,027

(22) Filed: Mar. 29, 2022

(65) Prior Publication Data
US 2022/0336000 A1 Oct. 20, 2022

(30) Foreign Application Priority Data
Apr. 16, 2021 (KR) ........................ 10-2021-0049954

(51) Int. Cl.
*G11C 11/00* (2006.01)
*G11C 11/16* (2006.01)
*H10B 61/00* (2023.01)
*H10N 50/10* (2023.01)
*H10N 50/80* (2023.01)

(52) U.S. Cl.
CPC ...... *G11C 11/1675* (2013.01); *G11C 11/1655* (2013.01); *G11C 11/1657* (2013.01); *G11C 11/1673* (2013.01); *G11C 11/1697* (2013.01); *H10B 61/20* (2023.02); *H10N 50/10* (2023.02); *H10N 50/80* (2023.02)

(58) Field of Classification Search
CPC ............ G11C 11/1675; G11C 11/1655; G11C 11/1657; G11C 11/1673; G11C 11/1697; H10N 50/80; H10N 50/10
See application file for complete search history.

(56) References Cited

U.S. PATENT DOCUMENTS

| | | | |
|---|---|---|---|
| 6,990,015 B2 | 1/2006 | Honda et al. | |
| 7,102,948 B2 | 9/2006 | Perner | |
| 7,224,630 B2 | 5/2007 | Andre et al. | |
| 7,453,719 B2 | 11/2008 | Sakimura et al. | |
| 7,639,522 B2 | 12/2009 | Cho et al. | |
| 7,881,094 B2 * | 2/2011 | Chen .................... | G11C 13/004 365/100 |

(Continued)

FOREIGN PATENT DOCUMENTS

| JP | 2010102767 A | 5/2010 |
|---|---|---|
| JP | 2018170065 A | 11/2018 |

*Primary Examiner* — Viet Q Nguyen
(74) *Attorney, Agent, or Firm* — Fish & Richardson P.C.

(57) ABSTRACT

A memory device includes; a memory cell array including a first memory cell region and a second memory cell region, a voltage generator configured to generate a code corresponding to a write voltage, and a write driver configured to store data in the first memory cell region in response to the code. The second memory cell region stores a value defining the write voltage, and the write voltage is determined in relation to a reference resistance distinguishing a parallel state and an anti-parallel state for the memory cells, and further in relation to an initial write voltage applied to a magnetic tunnel junction element of at least one of the memory cells.

20 Claims, 21 Drawing Sheets

(56) References Cited

U.S. PATENT DOCUMENTS

| | | | |
|---|---|---|---|
| 8,441,847 B2 | 5/2013 | Eleftheriou et al. | |
| 8,902,628 B2 | 12/2014 | Ha et al. | |
| 9,025,357 B2 * | 5/2015 | Chung | G11C 13/0004 |
| | | | 365/158 |
| 9,165,629 B2 | 10/2015 | Chih et al. | |
| 9,177,627 B2 | 11/2015 | Chen et al. | |
| 9,183,910 B2 * | 11/2015 | Lee | G11C 11/1675 |
| 9,251,881 B2 | 2/2016 | Kim et al. | |
| 9,251,893 B2 * | 2/2016 | Chung | G11C 11/5678 |
| 9,406,367 B2 | 8/2016 | Chih et al. | |
| 9,455,013 B2 | 9/2016 | Kim et al. | |
| 9,672,886 B2 * | 6/2017 | Wang | G11C 11/1675 |
| 9,679,643 B1 | 6/2017 | Chou | |
| 10,163,479 B2 | 12/2018 | Berger et al. | |
| 10,347,314 B2 | 7/2019 | Berger et al. | |
| 10,430,534 B2 * | 10/2019 | Gharia | G06F 30/3312 |
| 10,861,524 B1 * | 12/2020 | Roy | G11C 11/1693 |
| 11,087,799 B1 * | 8/2021 | Sakhare | G11C 11/1673 |
| 11,139,012 B2 * | 10/2021 | Pyo | H10N 50/80 |
| 11,410,704 B2 * | 8/2022 | Lau | H04N 21/44224 |
| 11,521,692 B2 * | 12/2022 | Choy | G11C 11/1673 |
| 2008/0285335 A1 | 11/2008 | Elmegreen et al. | |
| 2014/0192588 A1 | 7/2014 | Lee et al. | |
| 2018/0366187 A1 * | 12/2018 | Chien | G11C 13/0069 |
| 2022/0084591 A1 * | 3/2022 | Kim | G11C 13/0069 |

\* cited by examiner

FIG. 14

| MC | Initial Write Voltage | Rref | Risk | Trimmed Write Voltage |
|---|---|---|---|---|
| ① | High (V5) | High | Endurance | Low (V1) |
| ② | Low (V1) | Low | Write Failure | High (V5) |
| ③ | High (V4) | Low | - | Non-trim (V4) |
| ④ | Low (V2) | High | - | Non-trim (V2) |
| ⑤ | Moderate (V3) | Moderate | - | Non-trim (V3) |

… (1) …

MEMORY DEVICE GENERATING OPTIMAL WRITE VOLTAGE BASED ON SIZE OF MEMORY CELL AND INITIAL WRITE VOLTAGE

CROSS-REFERENCE TO RELATED APPLICATIONS

This U.S. nonprovisional application claims priority under 35 U.S.C. § 119 to Korean Patent Application No. 10-2021-0049954 filed on Apr. 16, 2021 in the Korean Intellectual Property Office, the subject matter of which is hereby incorporated by reference in their entirety.

BACKGROUND

The inventive concept relates generally to semiconductor devices, and more particularly, to memory devices including a magnetic tunnel junction element, as well as test methods thereof.

Contemporary and emerging electronic devices increasingly demand high-speed, high-reliability operation with relatively low power consumption. In order to satisfy these demands, certain memory devices now use a magnetic memory element. Because the magnetic memory element is nonvolatile in its operative nature and yet operates at high speed, memory devices including magnetic memory elements may prove excellent candidates for next-generation, semiconductor memory systems.

Certain magnetic memory elements include a magnetic tunnel junction (MTJ) element. The MTJ element may include two magnetic materials separated by an insulating layer. The resistance value of the MTJ element may vary in accordance with magnetization direction(s) of the two magnetic materials. For example, the MTJ element may exhibit a relatively "high" resistance when the magnetization directions of the two magnetic materials are opposite (or anti-parallel), and a relatively "low" resistance value when the magnetization directions of the two magnetic materials are the same (or parallel). Data may be read from and/or written (or programmed) to the memory device in accordance with a difference between these high/low resistance values.

In this context, it should be further noted that when data is written to a memory device using a voltage and/or current (hereafter, "voltage/current") having an excessive level (or magnitude), endurance issue(s) may arise in relation to the memory device. However, when data is written to the memory device using a voltage/current having an insufficient level, reliability issue(s) (e.g., write failures) may arise in relation to the operation of the memory device.

Of further note, the value (or level) of a write voltage/current may be stored in a memory device by the manufacturer of the memory device during testing of the memory device. Thereafter, the value of the write voltage/current, a one-time value determined by the manufacturer at the beginning of the memory device's life cycle, may have a significant influence on the overall performance of the memory device.

SUMMARY

Embodiments of the inventive concept provide memory devices and related methods of operation capable of determining a reference resistance using a minimum number of program operations and also determining an optimal write voltage in relation to the reference resistance.

Embodiments of the inventive concept provide memory devices and related methods of operation capable of determining an optimal write voltage in relation to a reference resistance and a write voltage applied to a magnetic junction element.

According to certain embodiments, a memory device may include; a memory cell array including a first memory cell region and a second memory cell region, a voltage generator configured to generate a code corresponding to a write voltage, and a write driver configured to store data in the first memory cell region in response to the code. The second memory cell region stores information (e.g., a value) defining the write voltage, and the write voltage is determined in relation to a reference resistance distinguishing a parallel state and an anti-parallel state for the memory cells, and further in relation to an initial write voltage applied to a magnetic tunnel junction element of at least one of the memory cells.

According to certain embodiments, a method of operating a memory device may include; programming memory cells of the memory device to a first state, and iteratively counting fail bits for the memory cells programmed to the first state using a plurality of resistances to generate a first counting result, programming the memory cells of the memory device to a second state, and iteratively counting fail bits for the memory cells programmed to the second state using the plurality of resistances to generate a second counting result, selecting one of the plurality of reference resistances as an optimal reference resistance in response to the first counting result and the second counting result, and determining a write voltage for the memory device in relation to the optimal reference resistance and an initial write voltage applied to a magnetic tunnel junction element of at least one of the memory cells.

According to certain embodiments, a memory device may include; a memory cell array including a first memory cell region and a second memory cell region, a column decoder configured to select a bit line connected to a selected memory cell among memory cells in the first memory cell region, a row decoder configured to drive the bit line connected to the selected memory cell, a voltage generator configured to generate a code corresponding to a program voltage for the memory device, and a write driver configured to drive a program current storing data in the selected memory cell in response to the code, and provide the program current to the selected memory cell through the bit line. The second memory cell region stores a value defining the program voltage and another value defining an optimal reference resistance, the optimal reference resistance is determined in relation to a first counting result of fail bits for memory cells in the first memory cell region programmed to a first state using a plurality of reference resistances, and a second counting result of fail bits for memory cells in the first memory cell region programmed to a second state using the plurality of reference resistances, and the program voltage is determined in relation to the reference resistance and an initial program voltage applied to at least one of memory cells of the first memory cell region and memory cells of the second memory cell region.

BRIEF DESCRIPTION OF THE DRAWINGS

The making and use, as well as related objects and features, of the inventive concept will become more apparent to those skilled in the art upon consideration of the following detail description, together with the accompanying drawings, in which:

FIG. 14 is a table listing possible values for an optimal write voltage determined according to the approach of FIG. 13;

DETAILED DESCRIPTION

Throughout the written description and drawings, like reference numbers and labels are used to denote like or similar elements, components and/or method steps.

Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Here, various elements and/or components may be described using terms like "unit", "module", "block", etc. In this regard, functional blocks associated with the inventive concept may be variously implemented in software and/or hardware. Software may include machine code, firmware, embedded code, and/or application level software. Hardware may include one or more electrical circuits, electronic components, processors, computers, integrated circuits and/or sensors, as well as various passive elements.

Figure 1:
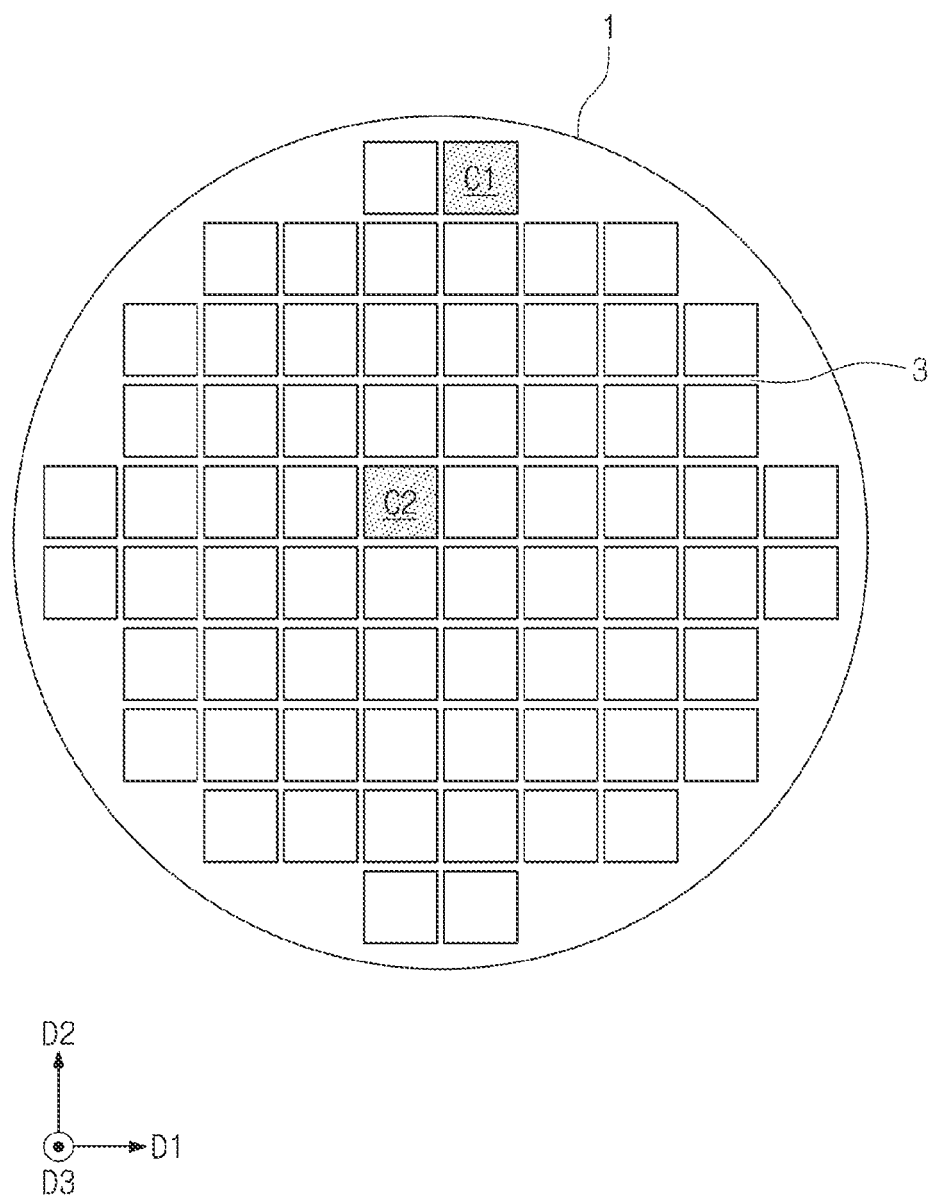
FIG. 1 illustrates a plan (or top-down) diagram illustrating a substrate including memory devices according to embodiments of the inventive concept.

FIG. 1 is a plan diagram illustrating a substrate 1 including memory devices according to embodiments of the inventive concept. The substrate 1 may include an arrangement of memory devices. Here, the memory devices (e.g., semiconductor chips), including a first memory device C1 and a second memory device C2, may be arranged according to (or respectively separated by) scribe line regions 3. Thus, the memory devices may be arranged in a two-dimensional (2D) array defined in relation to a first horizontal direction D1 and a second horizontal direction D2.

In some embodiments, the substrate 1 may be a semiconductor substrate such as a semiconductor wafer. The substrate 1 may be a bulk silicon substrate, a silicon on insulator (SOI) substrate, a germanium substrate, a germanium on insulator (GOI) substrate, a silicon-germanium substrate, or a substrate of an epitaxial thin film provided through selective epitaxial growth (SEG). For example, the substrate 1 may include at least one of silicon (Si), germanium (Ge), silicon germanium (SiGe), gallium arsenide (GaAs), Indium Gallium Arsenide (InGaAs), aluminum gallium arsenide (AlGaAs), or a mixture thereof. The substrate 1 may have a single crystalline structure.

Here, the first memory device C1 is an example of memory devices disposed in peripheral (or outer) regions of the substrate 1, whereas the second memory device C2 is an example of memory devices disposed in a central region of the substrate 1. In this regard, it should be noted that certain programming characteristic(s) (e.g., a reference resistance) of the respective memory devices may vary in accordance with their disposition location on the substrate 1. For example, assuming the memory devices include MRAM cells, the size of a particular MRAM cell may vary in relation to the location of the corresponding memory device on the substrate 1 (e.g., a first size of a first MRAM cell of the first memory device C1 may be relatively smaller than a second size of a second MRAM cell of the second memory device C2, due to variations in certain manufacturing process(es)).

Recognizing this outcome, embodiments of the inventive concept may determine the value of an optimal write current for memory cells of a memory device in relation to a relative location of the memory device on the substrate 1. Additionally, embodiments of the inventive concept may determine the value of an optimal write voltage for memory cells of a memory device in relation to a value of a write voltage applied to the memory cells. This approach significantly reduces the risk of write failures in the memory devices, thereby improving the reliability of the memory devices.

Figure 2:
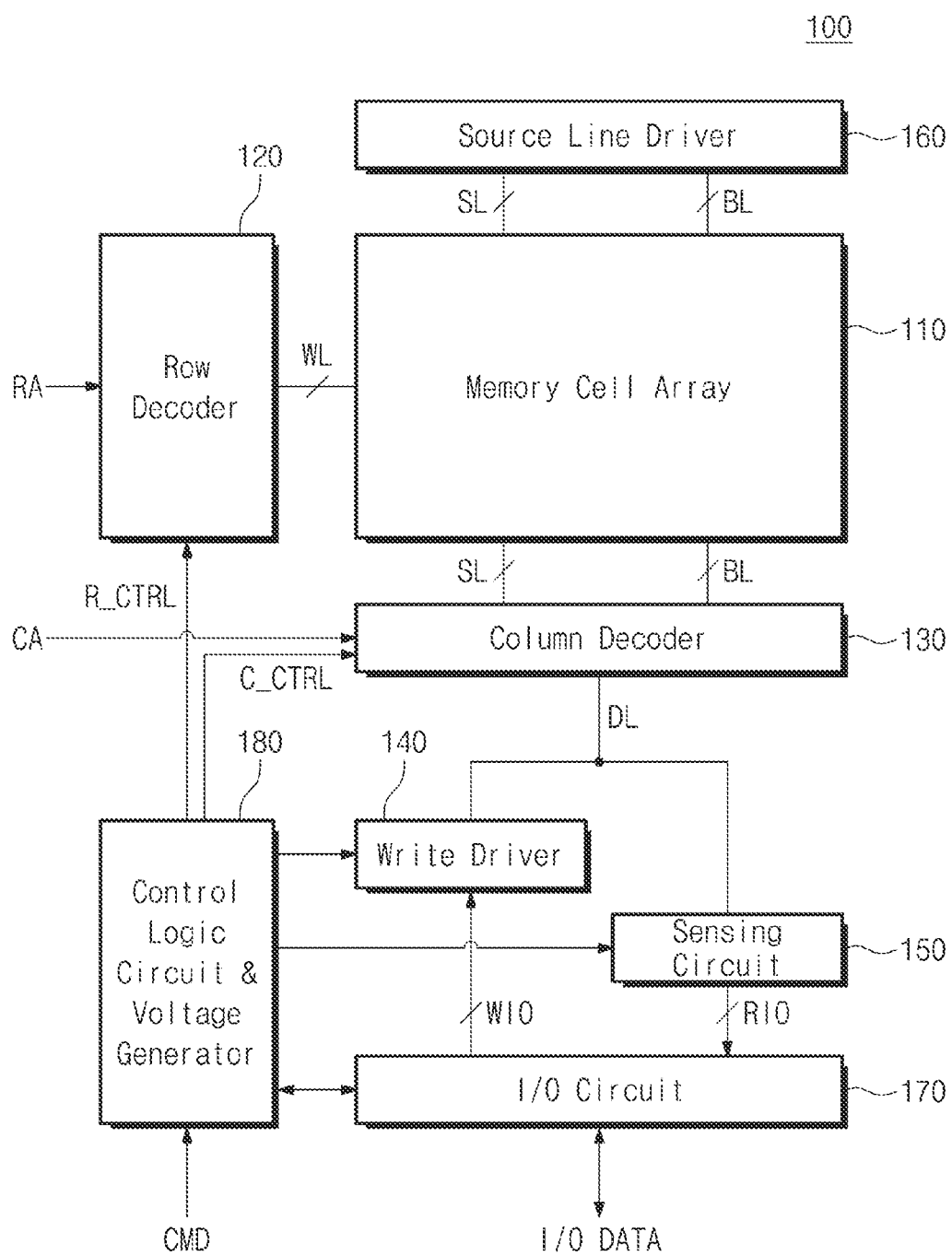
FIG. 2 is a block diagram illustrating one memory device 100 among the memory devices of FIG. 1.

FIG. 2 is a block diagram illustrating one possible memory device configuration 100 for the first memory device C1 and the second memory device C2 of FIG. 1.

Referring to FIG. 2, the memory device 100 may include a memory cell array 110, a row decoder 120, a column decoder 130, a write driver 140, a sensing circuit 150, a source line driver 160, an input/output (I/O) circuit 170, and a control logic circuit 180 including a voltage generator.

The memory cell array 110 may include memory cells respectively configured to store data. For example, each memory cell may include a variable resistance element, and a value of data stored in the variable resistance element may be determined based on a resistance value of the variable resistance element. For example, each memory cell may be a Magneto-resistive Random Access Memory (RAM) (MRAM) cell, a Spin Transfer Torque (STT-) MRAM) cell, a Phase-Change RAM (PRAM) cell, a Resistive RAM (ReRAM)) cell, etc. Hereafter, for consistency and clarity of description, it is assumed that each memory cell is an MRAM cell.

The memory cells of the memory cell array 110 may be variously connected to source lines SL, bit lines BL and word lines WL. In this regard, memory cells may be arranged in a row commonly connected to a word line corresponding to the row. Memory cells may be further arranged in a column commonly connected to a source line and a bit line corresponding to the column.

The row decoder 120 may select (or drive) the word line WL connected to a target memory cell identified in accordance with a read operation or a program operation (e.g., a memory cell identified by a row address RA and a row control signal R_CTRL). The row decoder 120 may provide the selected word line with a driving voltage generated by the control logic circuit and voltage generator 180.

The column decoder 130 may select the bit line BL and/or the source line SL connected to the target memory cell during the read operation or the program operation (e.g., a memory cell identified by a column address CA and a column control signal C_CTRL).

During the program operation, the write driver 140 may drive a program voltage (or a write current) for storing write data in a memory cell selected by the row decoder 120 and the column decoder 130. For example, during the program operation performed by the memory device 100, the write driver 140 may store the write data in the target (or selected) memory cell by controlling a voltage of a data line DL based on write data provided by the I/O circuit 170 through a write I/O line WIO.

In relation to FIG. 2 for clarity of illustration, a generic data line DL is shown. However, those skilled in the art will appreciate that the data line DL may be understood as corresponding to at least one bit line BL and at least one source line SL selected by the column decoder 130.

During the read operation, the sensing circuit 150 may sense a signal output through the data line DL and may determine a value of data stored in the selected memory cell. The sensing circuit 150 may be connected to the column decoder 130 through the data line DL and may be connected to the I/O circuit 170 through a read I/O line RIO. The sensing circuit 150 may output the sensed read data to the I/O circuit 170 through the read I/O line RIO.

The source line driver 160 may drive the source line SL with a voltage of a specific level under control of the control logic circuit and voltage generator 180. For example, the source line driver 160 may be provided with a voltage for driving the source line SL from the control logic circuit and voltage generator 180. For example, the level of a voltage applied by the source line driver 160 to the source line SL may vary in relation to the type of program operation being performed, such that the memory cell has a high resistance value (e.g., an anti-parallel state) or a low resistance value (e.g., a parallel state).

Although not specifically illustrated in FIG. 2, the memory device 100 may further include an anti-fuse array. Here, the anti-fuse array may include anti-fuses arranged in rows and columns. An anti-fuse may be a nonvolatile, one-time programmable (OTP) memory. In this regard, memory device information (e.g., various values) describing certain performance characteristics for the memory device 100 may be programmed using the anti-fuse array. This memory device information may include, for example, information identifying fail address(es) for the memory cell array 110, information describing various internal voltages (e.g., a program voltage and a read voltage) associated with the memory device 100, etc. Accordingly, in certain embodiments of the inventive concept, the memory device information stored in the anti-fuse array may include information identifying an optimal program voltage that has been determined during testing of the memory device.

Figure 3:
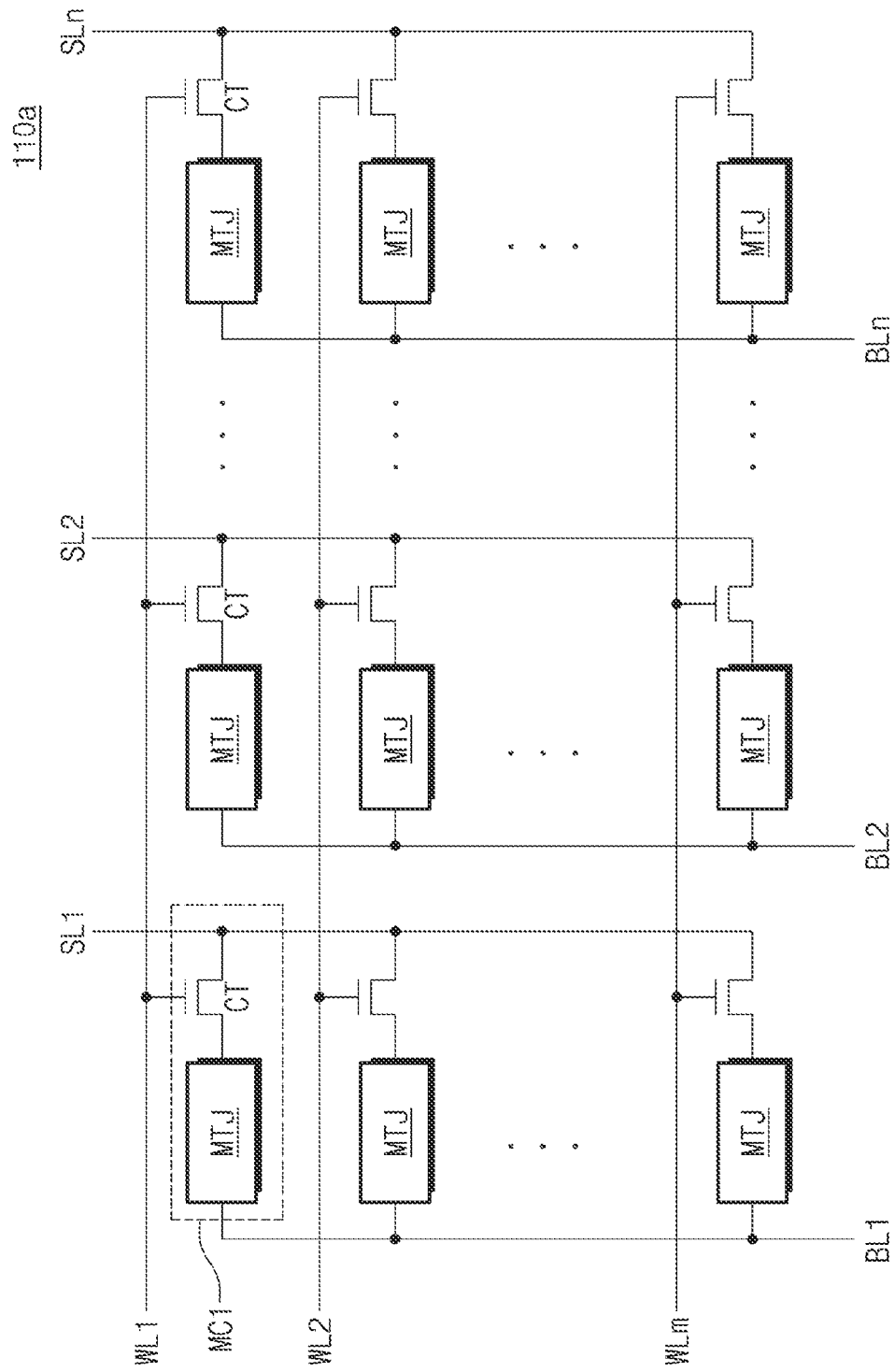
FIGS. 3 and 4 are respective circuit diagrams further illustrating in examples (110a, 110b) possible configurations for the memory cell array 110 of FIG. 2.

FIG. 3 is a circuit diagram illustrating one possible configuration (110a) for the memory cell array 110 of FIG. 2. Thus, the memory cell array 110a may include memory cells arranged in rows and columns directions, wherein each memory cell includes a magnetic tunnel junction (MTJ) element and a corresponding cell transistor (e.g., CT). With this configuration, the MTJ element of each memory cell may be programmed to have a specific resistance value in accordance with data stored in the memory cell. In FIG. 3, a first memory cell MC1 is indicated by a dotted box.

As shown in FIG. 3, the memory cells may be respectively connected among word lines WL1 to WLm, bit lines BL1 to BLn, and source lines SL1 to SLn. Thus, in relation to the first memory cell MC1, a first end of the MTJ element is connected to a first bit line BL1, a second end of the MTJ element is connected to a first end of the cell transistor CT, a second end of the cell transistor CT is connected to the source line SL1, and a gate electrode of the cell transistor CT is connected to a first word line WL1.

Figure 4:
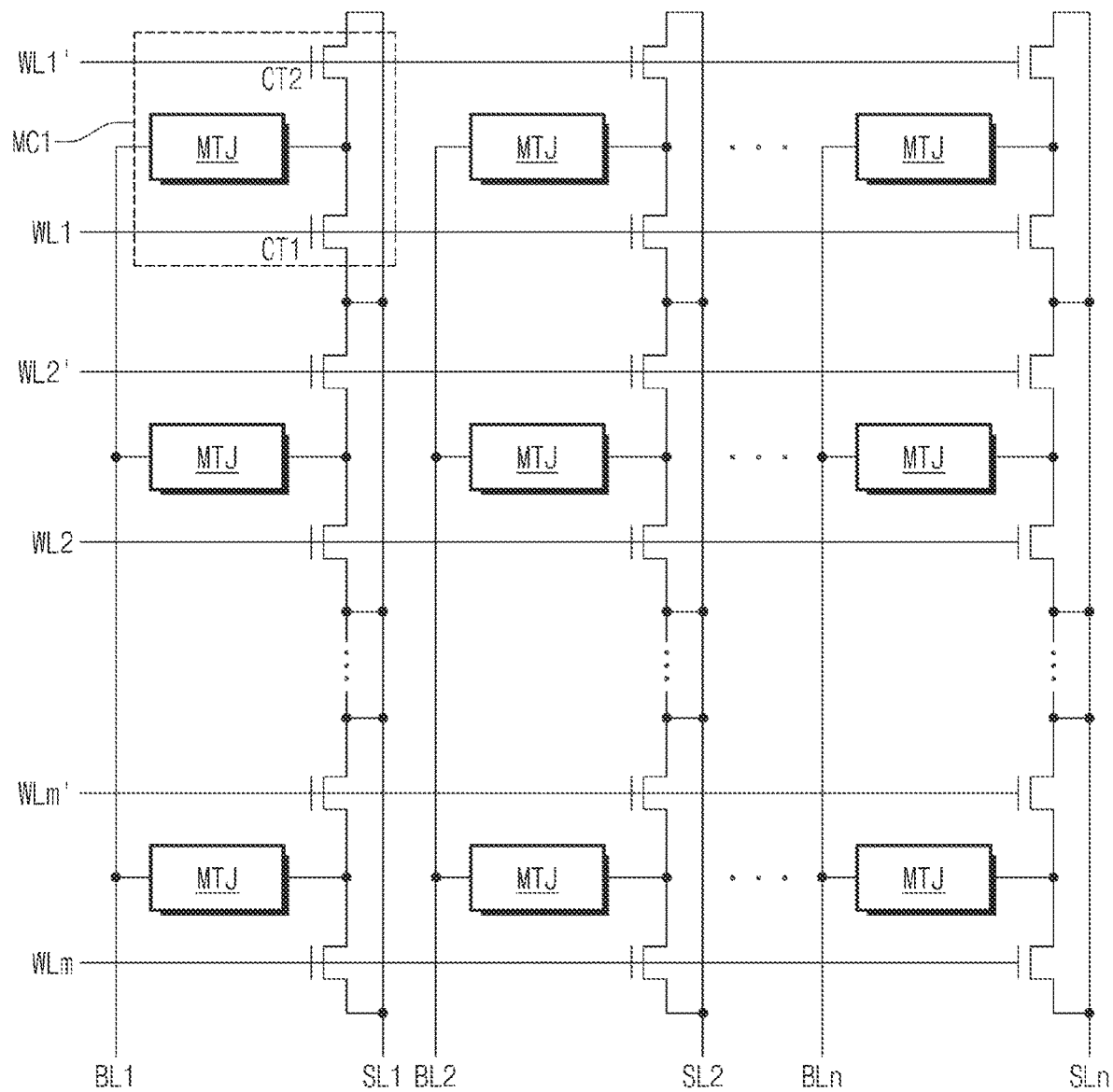

FIG. 4 is a circuit diagram illustrating another possible configuration (100b) for the memory cell array 110 of FIG. 2. Thus, the memory cell array 110b may include memory cells arranged in row and column directions, wherein each memory cell includes an MTJ element and two cell transistors (e.g., CT1 and CT2). In FIG. 4, a first memory cell MC1 is indicated by a dotted box.

As shown in FIG. 4, the memory cells may be respectively connected among word lines WL1 to WLm, bit lines BL1 to BLn, and source lines SL1 to SLn. Thus, in relation to the first memory cell MC1, two cell transistors CT1 and CT2 share the one MTJ element, wherein a first end of the MTJ element is connected to a first bit line BL1, a second end of the MTJ element is connected to first ends of the first and second cell transistors CT1 and CT2, second ends of the cell transistors CT1 and CT2 are connected to the first source line SL1, a gate electrode of the first cell transistor CT1 is connected to the first word line WL1, and a gate electrode of the second cell transistor CT2 is connected to a first sub-word line WL1'. Here, each of the cell transistors CT1 and CT2 may be switched ON/OFF in accordance with a signal (e.g., a voltage) provided by the first word line WL1 and/or the first sub-word line WL1.

Figure 5:
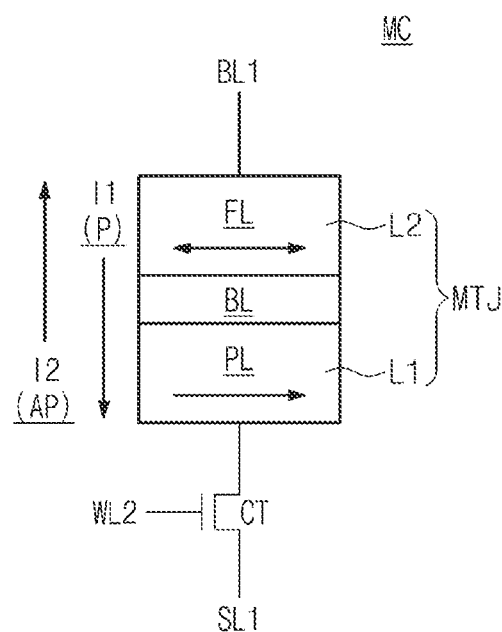
FIGS. 5 and 6 are respective block diagrams illustrating possible configurations for the memory cell MC1 of FIG. 3.
Figure 6:
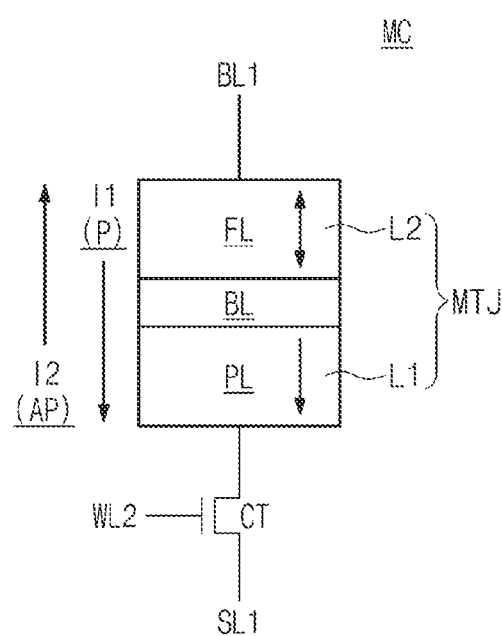

FIGS. 5 and 6 are respective block diagrams illustrating possible configurations for a memory cell MC of FIGS. 3 and 4.

Referring to FIGS. 5 and 6, an MTJ element may include a first magnetic layer L1, a second magnetic layer L2, and a barrier layer BL (or a tunneling layer) interposed between the first magnetic layer L1 and the second magnetic layer L2. The barrier layer BL may include at least one of magnesium (Mg) oxide, titanium (Ti) oxide, aluminum (Al) oxide, magnesium-zinc (Mg—Zn) oxide, or magnesium-boron (Mg—B) oxide, or a combination thereof. Each of the first magnetic layer L1 and the second magnetic layer L2 may include at least one magnetic layer.

Here, the first magnetic layer L1 may include a reference layer (e.g., a pinned layer PL) having a magnetization direction fixed (or pinned) in a specific direction, and the second magnetic layer L2 may include a free layer FL having a magnetization direction that is changeable to be parallel or anti-parallel to the magnetization direction of the reference layer. As shown in FIGS. 5 and 6 by way of example, the first magnetic layer L1 may include the reference layer PL and the second magnetic layer L2 may include the free layer FL, but the scope of the inventive concept is not limited thereto. For example, alternately, the first magnetic layer L1 may include a free layer and the second magnetic layer L2 may include a pinned layer.

As shown in FIG. 5, magnetization directions may be mostly parallel to an interface of the barrier layer BL and the first magnetic layer L1. In this case, each of the reference layer PL and the free layer FL may include a ferromagnetic material. For example, the reference layer PL may further include an anti-ferromagnetic material for pinning a magnetization direction of the ferromagnetic material.

As shown in FIG. 6, magnetization directions may be mostly perpendicular to an interface of the barrier layer BL and the first magnetic layer L1. In this case, each of the reference layer PL and the free layer FL may include at least one of perpendicular magnetic materials (e.g., CoFeTb, CoFeGd, or CoFeDy), perpendicular magnetic materials with an L10 structure, CoPt-based materials with a hexagonal-close-packed-lattice structure, and perpendicular magnetic structures, or a combination thereof. The perpendicular magnetic material with the L10 structure may include at least one of FePt with the L10 structure, FePd with the L10 structure, CoPd with the L10 structure, or CoPt with the L10 structure, or a combination thereof. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where n is the number of stacked pairs of layers, or a combination thereof. Here, a thickness of the reference layer PL may be greater than a thickness of the free layer FL, or a coercive force of the reference layer PL may be greater than a coercive force of the free layer FL.

In some embodiments, when a relatively high voltage is applied to the bit line BL1 and a relatively low voltage is applied to the source line SL1, a write current I1 may flow. In this case, a magnetization direction of the second magnetic layer L2 may be the same as a magnetization direction of the first magnetic layer L1, and the MTJ element may have a low resistance value (i.e., a parallel state). Alternately, when a relatively high voltage is applied to the source line SL1 and a relatively low voltage is applied to the bit line BL1, a write current I2 may flow. In this case, a magnetization direction of the second magnetic layer L2 may be opposite to a magnetization direction of the first magnetic layer L1, and the MTJ element may have a high resistance value (i.e., an anti-parallel state).

Here, in the case where the MTJ element is in the parallel state, the memory cell MC may be interpreted as storing data having a first value (e.g., a logical value of "0"). Alternately, in the case where the MTJ element is in the anti-parallel state, the memory cell MC may be interpreted as storing data having a second value (e.g., a logical value of "1").

It should be further noted that only one cell transistor CT is illustrated in FIGS. 5 and 6. However, the example illustrated in FIGS. 5 and 6 may be applied to a memory cell MC of FIG. 4. In this case, the cell transistors CT1 and CT2 may be connected to one end of the MTJ element. And in basic principle of operation, the MTJ element may be programmed as described in relation to FIG. 4, except that a programming current path may change depending on which cell transistor is turned ON among the first and second cell transistors CT1 and CT2.

Figure 7:
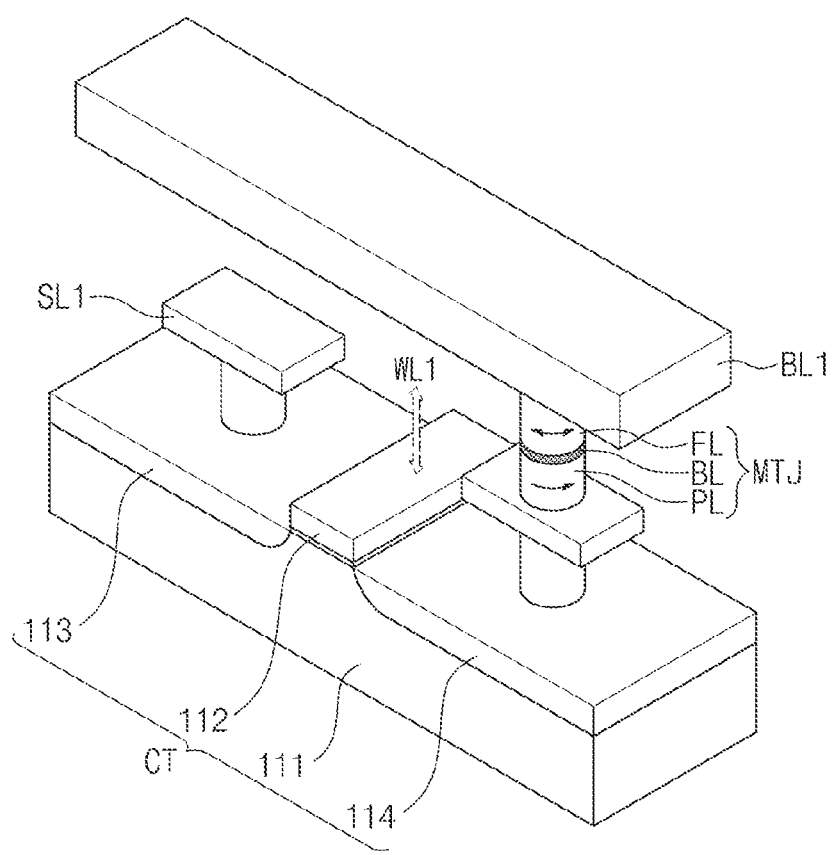
FIG. 7 is a perspective diagram illustrating a possible configuration for the memory cell MC1 of FIG. 4.

FIG. 7 is a perspective diagram illustrating a possible configuration for a memory cell MC of FIGS. 3 and 4.

Here, the cell transistor CT may include a body substrate 111, a gate electrode 112, and junctions 113 and 114. The junction 113 may be provided on the body substrate 111 and may be connected to the source line SL1. The junction 114 may be provided on the body substrate 111 and may be connected to the bit line BL1 through the MTJ element. The gate electrode 112 may be provided on the body substrate 111 between the junctions 113 and 114 and may be connected to the word line WL1. Like the embodiment described in relation to FIG. 4, in the case where two cell transistors share one MTJ element, a modified version of the configuration illustrated in FIG. 7 may be adopted.

Figure 8:
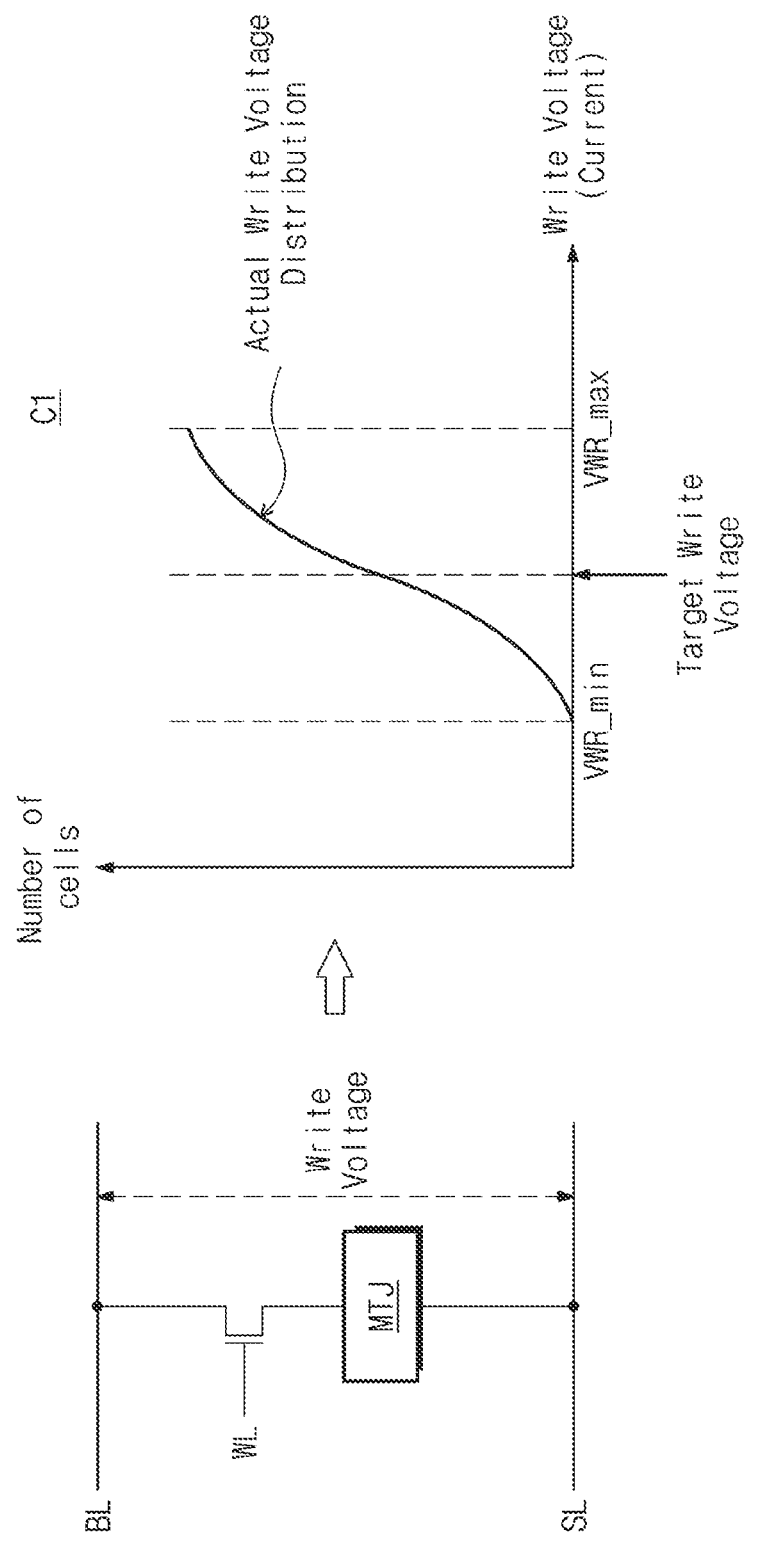
FIG. 8 is a conceptual diagram illustrating a distribution of a write voltage for an MTJ element.

FIG. 8 illustrates a distribution of a write voltage for an MTJ element as an example of MTJ elements associated with the first memory device C1 of FIG. 1. Referring to FIG. 8, the "write voltage" is a voltage applied between the bit line BL and the source line SL, and may be a voltage used to program the MTJ element to a specific data state. Here, it is further assumed that the first memory device C1 has been fabricated such that a nominal write voltage level (i.e., a "target write voltage") indicated by the manufacturer of the first memory device C1 will be applied across the MTJ element.

However, due to variations in one or more fabrication processes as well as related memory device performance characteristic(s), the value (or level) of a write voltage actually applied to the MTJ element (i.e., an "initial write voltage") may be different from the specified value of the target write voltage. Accordingly, the write voltage actually applied to MTJ elements of the first memory device C1 may vary over a range like the one show in FIG. 8. That is, some of the MTJ elements of the first memory device C1 may receive a write voltage having a level that differs significantly from the defined level of the target write voltage. Indeed, it is possible that the level of the write voltage actually applied to the MTJ elements may vary between a write voltage maximum VWR_max and a write voltage minimum VWR_min.

Accordingly, when the first memory device C1 is conventionally tested to determine an optimal write voltage, the value of the optimal write voltage may be obtained by testing a particular MTJ element (i.e., a test MTJ element) associated with the first memory device C1. For example, when a value of the write voltage actually applied to the particular test MTJ element is greater than the defined value of the target write voltage, it is possible that the first memory device C1 may be fabricated to provide a write voltage having a value less than the defined level of the target write voltage. Additionally or alternatively, when a value of the write voltage actually applied to the particular test MTJ element is less than the defined value of the target write voltage, it is possible that the first memory device C1 may be fabricated to provide a write voltage having a value greater than the defined level of the target write voltage.

In contrast, a memory device according to embodiments of the inventive concept may determine a value of an optimal write voltage in relation to consideration other than a value of a write voltage actually applied to an MTJ element. That is, the memory device according to embodiments of the inventive concept may determine a value of an optimal write voltage for the first memory device C1 in relation to a size of the MTJ element and/or a value of a reference resistance. Hereafter, the determination of a write voltage in relation to a size of an MTJ element and/or a reference resistance will be described in relation to FIGS. 9, 10 and 11.

Figure 9:
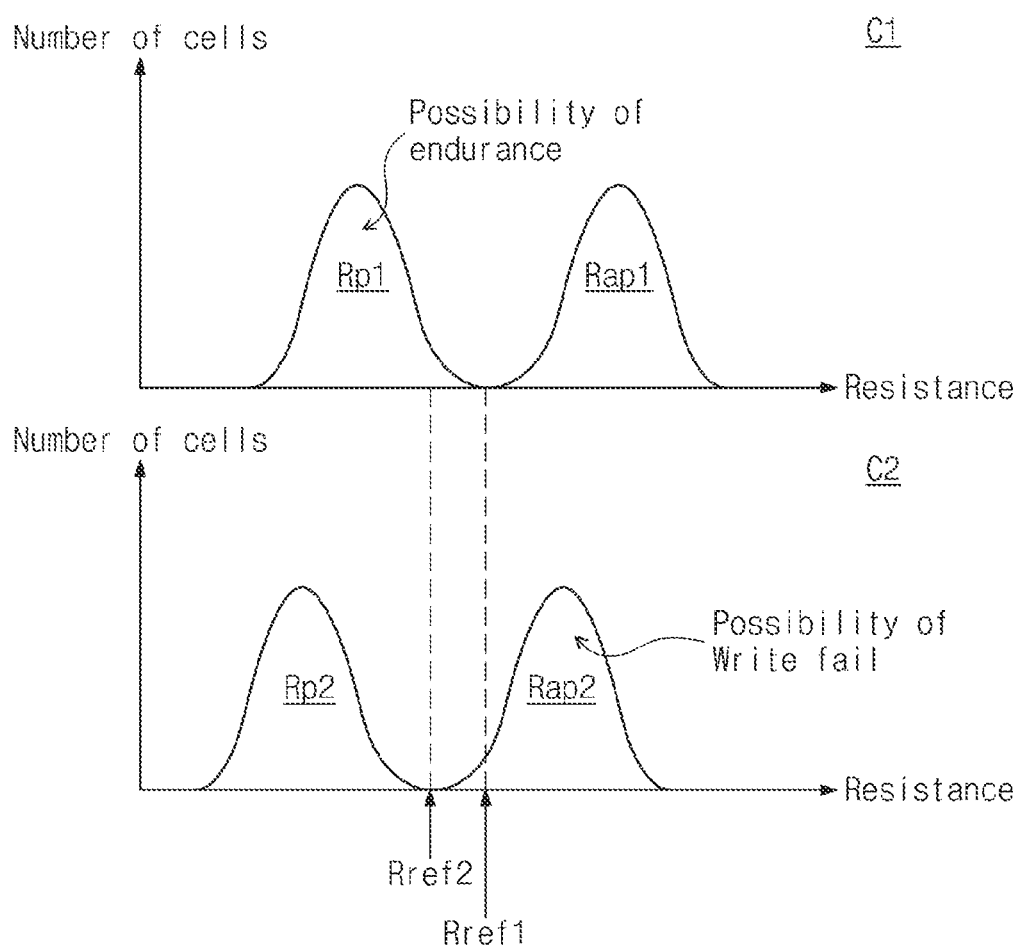
FIG. 9 is a graph illustrating a program state for the memory cells of FIGS. 5 and 6.

FIG. 9 is a graph illustrating various program states for the memory cells of the first memory device C1 and the second memory device C2 of FIG. 1.

As noted above in relation to FIG. 1, a programming characteristic of a memory device may vary depending on a location of the memory device on the substrate 1. For example, a first resistance distribution diagram corresponding to the first memory device C1 may be different from a second resistance distribution diagram corresponding to the second memory device C2. That is, first resistance value(s) for memory cells of the first memory device C1 may be relatively greater than second resistance value(s) for memory cells of the second memory device C2. Accordingly, first write voltage/current(s) necessary to successfully perform write operations for memory cells of the first memory device C1 may be less than second write voltage/current(s) necessary to successfully perform write operations for memory cells of the second memory device C2, because the size of memory cells (e.g., MRAM memory cells) of the first memory device C1 may be respectively smaller than a size of memory cells of the second memory device C2.

Hence, the graph of FIG. 9 shows a first resistance distribution Rp1 for memory cells of the first memory device C1 programmed to the parallel state, and a second resistance distribution Rap1 for memory cells of the first memory device C1 programmed to the anti-parallel state. Of note, these two resistance distributions Rp1 and Rap1 may be effectively distinguished using a write voltage corresponding to a first reference resistance Rref1. Comparatively, FIG. also 9 shows a first resistance distribution Rp2 for memory cells of the second memory device C2 programmed to the parallel state, and a second resistance distribution Rap2 for memory cells of the second memory device C2 programmed to the anti-parallel state. Of note, however, these two resistance distributions Rp2 and Rap2 may be effectively distinguished using a different write voltage corresponding to a second reference resistance Rref2.

Under certain circumstances, the level of a write voltage corresponding to the first reference resistance Rref1 may be unsuited to correctly distinguish programmed memory cells of the second memory device C2, since a relatively higher level write voltage is required to properly program the memory cells of the second memory device C2 given their relatively larger size. That is, a write failure may occur when a write operation directed to memory cells of the second memory device C2 is performed using a relatively lower write voltage corresponding to the first reference resistance Rref1.

Under other circumstances, the level of a write voltage corresponding to the second reference resistance Rref2 may be unsuited to program memory cells of the first memory device C1, since a relatively lower level write voltage is required to program the memory cells of the first memory device C1 given their relatively smaller size. That is, when a write operation directed to the first memory device C1 is performed using a relatively higher write voltage corresponding to the second reference resistance Rref2, endurance issues related to the corresponding memory cells may arise in the first memory device C1.

From the foregoing it will be appreciated that various unintended and adverse issues may arise when write operations are performed using a same write voltage in relation to memory cells of the first memory device C1 verses memory cells of the second memory device C2, although the first memory device C1 and the second memory device C2 are fabricated on a common wafer.

Figure 10:
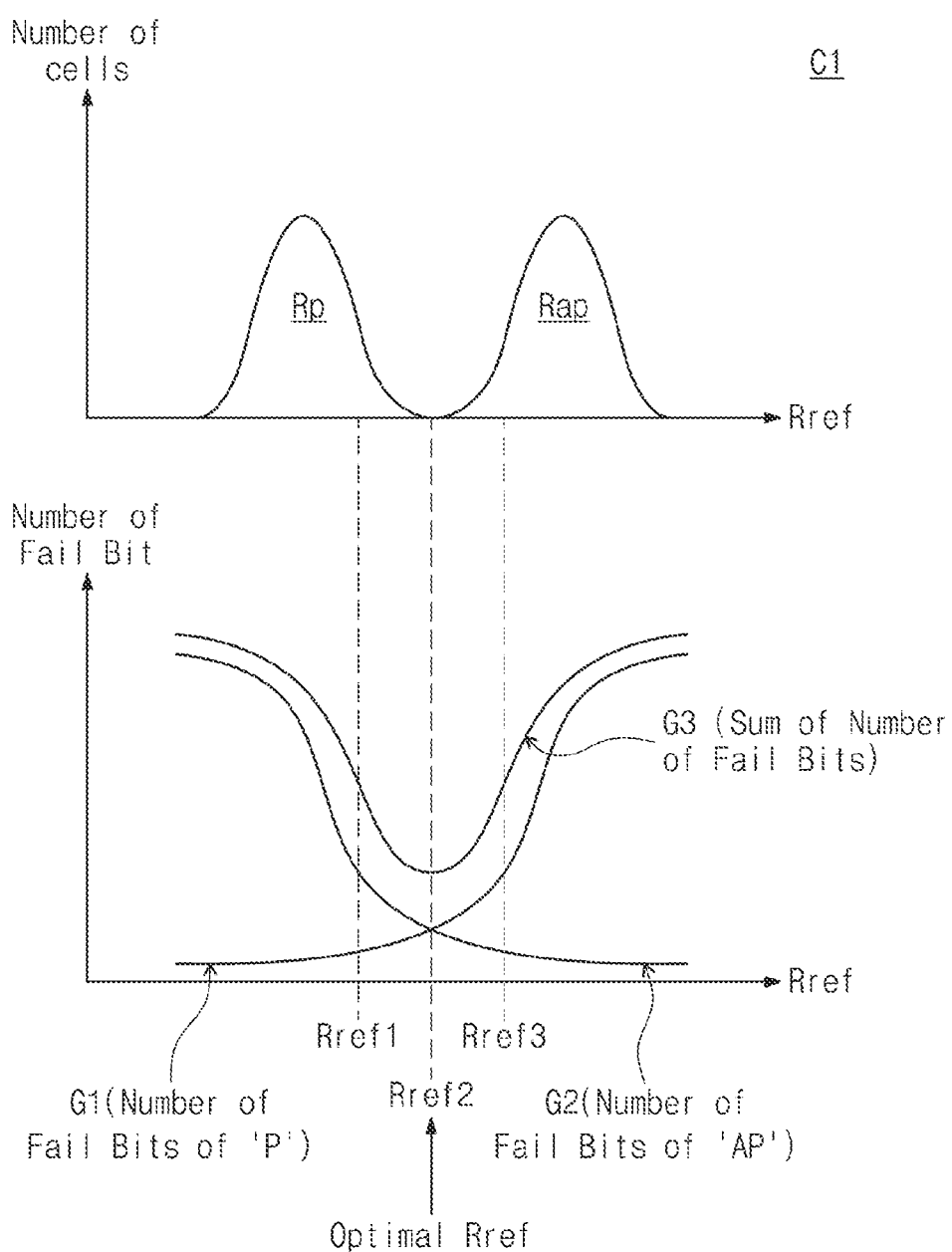
FIG. 10 is a graph illustrating an approach to determining an optimal reference resistance corresponding to an optimal write voltage for memory devices according to embodiments of the inventive concept.

FIG. 10 is another graph illustrating a determination of a value of a reference resistance corresponding to an optimal program voltage for memory devices according to embodiments of the inventive concept.

Referring to FIG. 10, during testing of a memory device a pre-program operation may be performed. Here, the pre-program operation is a specialized, post-fabrication programming operation used to identify (or search for) a value of an optimal reference resistance optimally distinguishing the parallel state from the anti-parallel state. In this regard, for example, a level of a program voltage applied to the memory device during the pre-program operation may be higher than a level of a program voltage normally applied to the memory device during consumer use. In this manner, the pre-program operation may be associated with identifying and preventing program failure(s).

Accordingly, memory cells of a memory device being tested may be programmed to the parallel state using a test device (e.g., automatic test equipment (ATE)). Referring to FIG. 10 and consistent with the description of FIG. 9, "Rp" indicates a distribution of resistance values of memory cells programmed to the parallel state. Thereafter, a number of fail bits of the memory device may be counted using the test device. For example, in a case wherein the write operation is performed by using a write voltage corresponding to a relatively lower value of a reference resistance (e.g., the first reference resistance Rref1), the number of fail bits may be relatively few. However, as a value of the reference resistance increases (e.g., a level of the write voltage decreases), the number of fail bits of the memory device may increase. Accordingly, the portion of the graph of FIG. 10 indicated as 'G1' shows this tendency in the number of counted fail bits.

The memory cells of the memory device may be programmed to the anti-parallel state by using the test device. Again referring to FIG. 10, "Rap" indicates a distribution of resistance values of memory cells programmed to the anti-parallel state. Thereafter, a number of fail bits of the memory device may be counted using the test device. For example, in a case wherein the write operation is performed by using a write voltage corresponding to a relatively lower value of a reference resistance (e.g., the first reference resistance Rref1), the number of fail bits may be relatively many. However, as a value of the reference resistance increases (or a value of the write voltage decreases), the number of fail bits of the memory device may decrease. Accordingly, the portion of the graph of FIG. 10 indicated as 'G2' shows this tendency in the number of counted fail bits.

Afterwards, the test device may determine a value of an optimal reference resistance using data regarding counted fail bits. For example, the test device may sum the graph G1 indicating the number of fail bits measured in the parallel state and the graph G2 indicating the number of fail bits measured in the anti-parallel state to generate the portion of the graph of FIG. 10 indicated as 'G3'. In particular, the graph indicated as 'G3' identifies a resistance value (i.e., Rref2) corresponding to a fewest number of fail bits which may be correlated to a value of an optimal reference resistance for the memory device being tested.

Accordingly, the test device may determine, among other memory device performance characteristics: (1) a value of an optimal write voltage for the memory device based on the value of the optimal reference resistance (i.e., Rref2); (2) a value of the write voltage in relation to a previously measured size of a memory cell; (3) a reference resistance value corresponding to the size of the memory cell, and (4) the relationship between the level of a program voltage and the reference resistance value.

In a case wherein an optimal reference resistance value is relatively low (e.g., Rref1), a size of the memory cell (e.g., a MRAM cell) of the memory device may be relatively large, which may indicate that a relatively higher level write voltage is required. In contrast, in a case wherein an optimal reference resistance value is relatively high (e.g., Rref3), a size of the memory cell of the memory device may be relatively small, which may indicate that a relatively lower level write voltage is required.

Assuming that the foregoing approach is applied to the first memory device C1 and the second memory device C2 of FIG. 1, a relatively-higher, optimal reference resistance value (e.g., Rref3) may be determined for the first memory device C1. Accordingly, the first memory device C1 may require a relatively lower level write voltage during write operations. Additionally or alternately, a relatively-lower, optimal reference resistance value (e.g., Rref1) may be determined for the second memory device C2. Accordingly, the second memory device C2 may require a relatively higher level write voltage during write operations.

Figure 11:
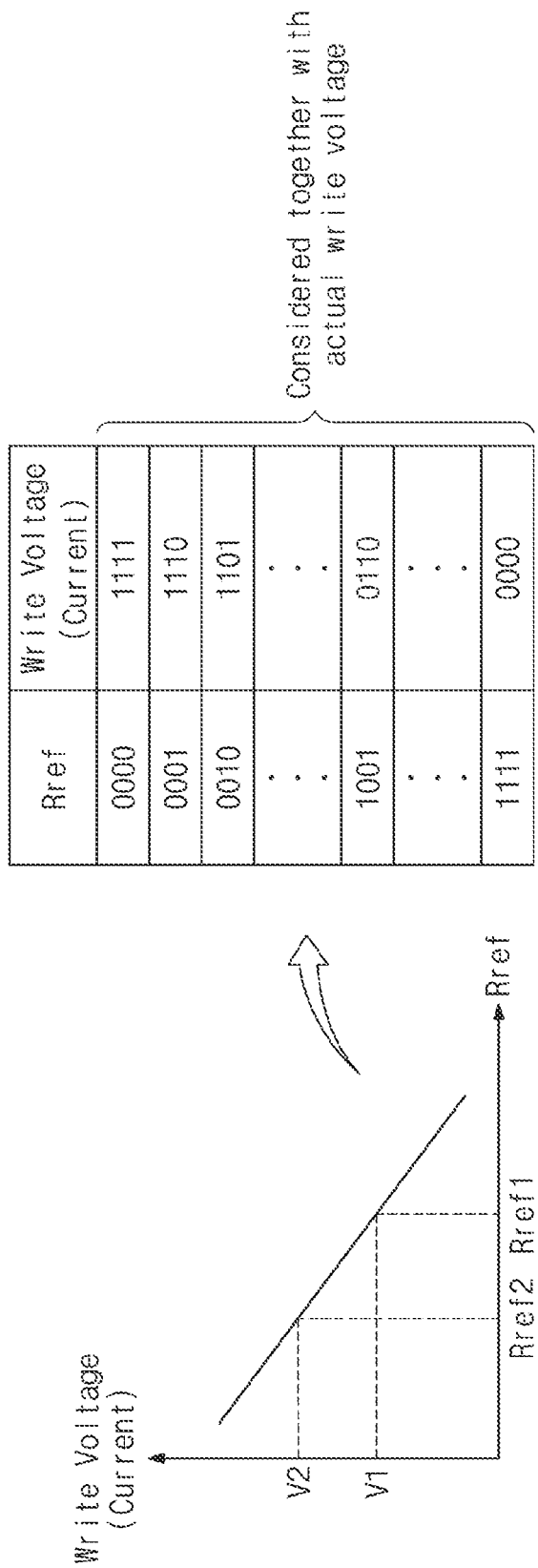
FIG. 11 is a conceptual diagram illustrating a relationship between a reference resistance determined during testing of a memory device and a corresponding write voltage.

FIG. 11 is conceptually diagram illustrating a relationship between values of a reference resistance determined during testing of a memory device and values of a corresponding write voltage.

Here, a value of a reference resistance for a memory device may be inversely proportional (in a general manner) to a value of a write voltage/current for the memory device. Accordingly, the value of a write voltage may decrease as the value of the reference resistance increases.

Referring to the graph portion of FIG. 11, the relatively higher first reference resistance Rref1 exhibited by the memory cells of the first memory device C1 and a corresponding and relatively lower level first write voltage 'V1', given the relatively smaller size of the memory cells of the first memory device C1. By way of comparison, the graph portion of FIG. 11 also shows the relatively lower second reference resistance Rref2 exhibited by the memory cells of the second memory device C2 and a corresponding and relatively higher level second write voltage 'V2', given the relatively larger size of the memory cells of the second memory device C2.

Referring to the table portion of FIG. 11, it is assumed by way of example that each value for the reference resistance and each value for the corresponding write voltage/current is expressed using four (4) bits. In this case where a reference resistance value is expressed by 4 bits, the fail bit counting operation described in relation to FIG. 9 may be performed sixteen (16) or fewer times for each fail bit counting operation for the parallel state and for each fail bit counting operation for the anti-parallel state. Hence, a write voltage/current may be vary between a first value corresponding to "1111" and a second value corresponding to "0000".

In some embodiments, a table like the one illustrated in FIG. 11 may be used to determine relationship(s) between reference resistance(s) (e.g., "1001") and corresponding write voltage(s) (e.g., "0110") for a memory device. Thereafter, the resulting values may be used to determine an optimal write voltage, together with a write voltage distribution like the one described in relation to FIG. 8 during testing of the memory device.

Figure 12:
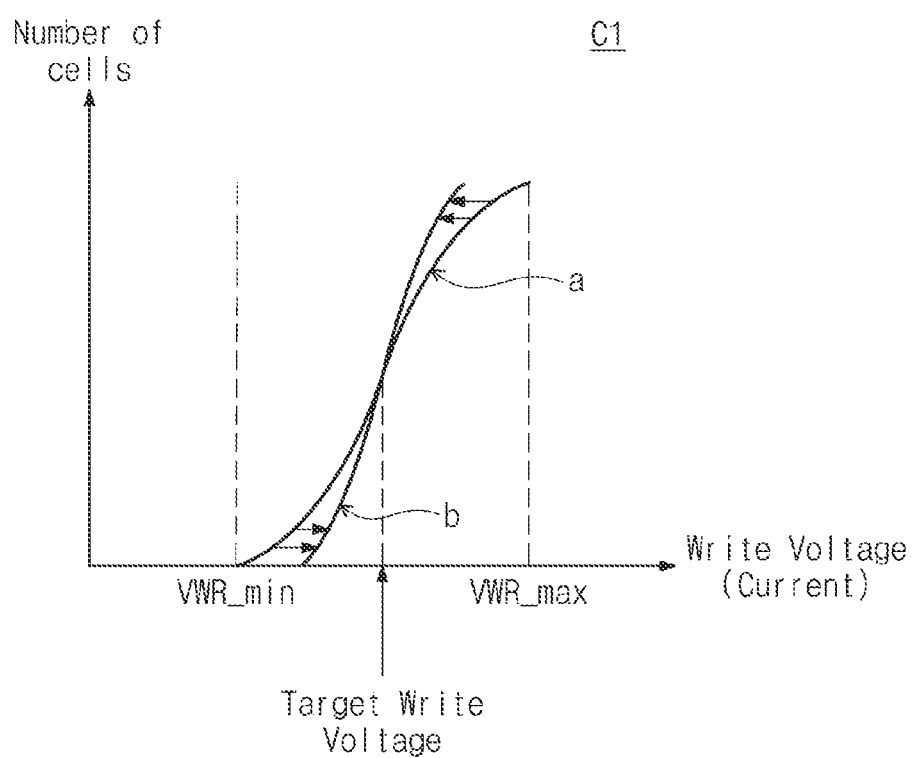
FIG. 12 is a graph illustrating an approach to determining an optimal write voltage in consideration of only a write voltage distribution for MTJ elements.
Figure 13:
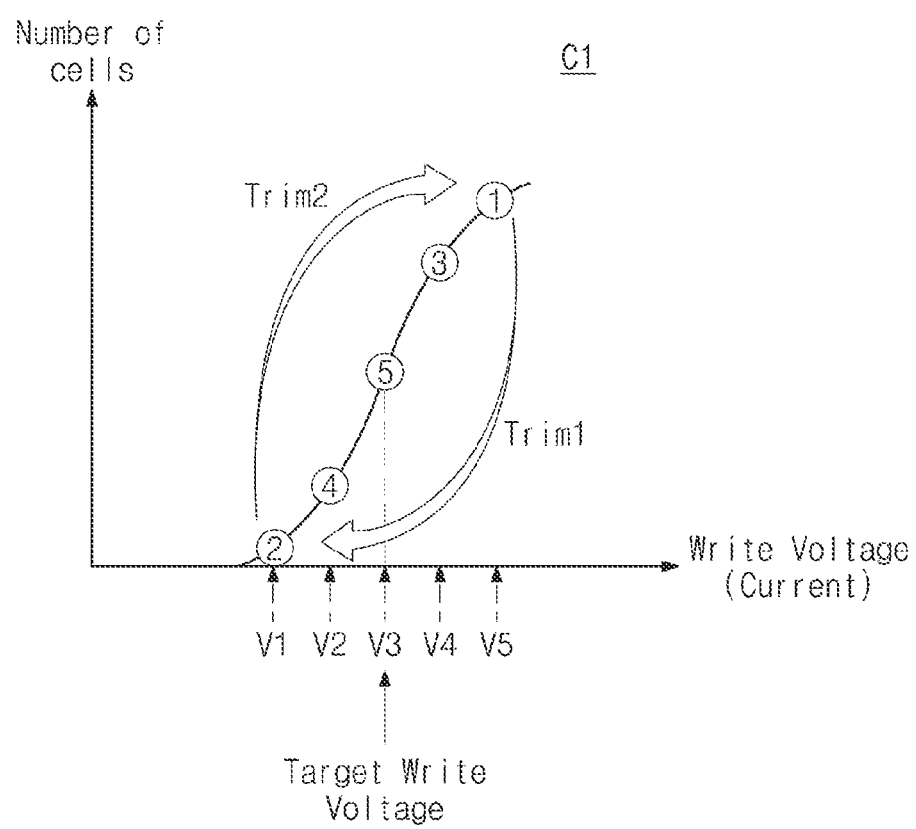
FIG. 13 is a conceptual diagram illustrating an approach to determining an optimal write voltage in consideration of a write voltage distribution of MTJ elements and a size of a memory device.

FIG. 12 is a graph illustrating a determination of an optimal write voltage in consideration of a write voltage distribution of MTJ elements, FIG. 13 is a graph illustrating a determination of an optimal write voltage in consideration of a write voltage distribution of MTJ elements and a size of memory cells of a memory device, and FIG. 14 is a table listing value(s) for the optimal write voltage determined in relation to FIG. 13.

Referring to FIG. 12, a graph portion "a" is an initial write voltage distribution, and a graph portion "b" is a trimmed write voltage distribution. For example, in the case where a write voltage actually applied to an MTJ element is relatively high (e.g., VWR_max), a memory device may be fabricated such that a write voltage having a lower level than a target write voltage is actually applied to the MTJ element. As previously described, in the case where the write voltage actually applied to the MTJ element is relatively low (e.g., VWR_min), a memory device may be fabricated such that a write voltage having a higher level than the target write voltage is actually applied to the MTJ element. That is, through the illustrated trimming process, a first write voltage distribution "a" may be shifted to yield a second write voltage distribution "b".

However, when determining an optimal write voltage in consideration of a value of a write voltage actually applied to an MTJ element, unintended write failures or memory cell endurance issues may arise. For example, in a case wherein a high write voltage is applied to an MTJ element without consideration of the size of the MTJ element, memory cell endurance issues may arise at an MTJ element having a relatively small size. In contrast, in a case wherein a low write voltage is applied to an MTJ element without consideration of a size of the MTJ element, write failures may arise at an MTJ element having a relatively large size.

Referring to FIGS. 13 and 14, illustrated write voltages actually applied to five (5) MTJ elements are indicated as ① to ⑤. In the case of the MTJ element ⑤, because a target write voltage and an actually applied write voltage are the same, there is no need to trim the write voltage. That is, during subsequently performed write operations, the write voltage V3 may be applied to the MTJ element.

In the case of the MTJ element ①, wherein a size of the MTJ element is small and exhibits a high reference resistance, a voltage V5 having an excessively high level is applied to the MTJ element, thereby risking memory cell endurance issues. Accordingly, there is a need to apply a relatively low write voltage (e.g., V1) to the MTJ element (Trim 1). Accordingly, a memory device may be fabricated such that a write operation is performed on the MTJ element ① using the relatively low write voltage V1.

In the case of the MTJ element ②, wherein a size of the MTJ element is large and exhibits a low reference resistance, the voltage V1 having an inadequately low magnitude is applied to the MTJ element, thereby risking write failures. Accordingly, there is a need to apply a relatively high write voltage (e.g., V5) to the MTJ element (Trim 2). Accordingly, a memory device may be fabricated such that a write operation is performed on the MTJ element ② using the relatively high write voltage V5.

In the case of the MTJ element ③, a level of an initial write voltage is relatively high (e.g., V4), and a size of the MTJ element may be relatively large. That is, the MTJ element may exhibit a low reference resistance value. In the case wherein an optimal write voltage is determined in consideration of a value of an initial write voltage, the value of the optimal write voltage may be relatively high (e.g., V4). In the case wherein the optimal write voltage is determined in consideration of the low reference resistance value, the level of the optimal write voltage may be relatively high (e.g., V4). Accordingly, considering the initial write voltage and the reference resistance value together, a level of the optimal write voltage for the MTJ element ③ may be determined to have the relatively high value of voltage V4.

In the case of the MTJ element ④, a value of an initial write voltage may be relatively low (e.g., V2), and the size of the MTJ element may be relatively small. That is, the MTJ element may have a high reference resistance value. In the case wherein the optimal write voltage is determined in consideration of a value of an initial write voltage, the value of the optimal write voltage may be relatively low (e.g., V2). In the case wherein the optimal write voltage is determined in consideration of the high reference resistance value, the value of the optimal write voltage may be relatively low (e.g., V2). Accordingly, considering the initial write voltage and the reference resistance value together, a value of an optimal write voltage for the MTJ element ④ may be determined as a relatively low value of the voltage V2.

As described above, according to embodiments of the inventive concept, an optimal write voltage should not be determined in consideration of only a magnitude of a write voltage actually applied to a particular test MTJ element, or only in consideration of a size of particular MTJ element(s) (i.e., a reference resistance value). Instead, an optimal write voltage for an MTJ element should be determined in accordance with the various relationships highlighted in the table of FIG. 14. That is, an optimal write voltage may be accurately determined for each MTJ element. Alternately, an optimal write voltage may be determined for defined 'units' of memory cells (e.g., memory cells in a specific region or block of a memory device). Accordingly, during testing a memory device, an optimal write voltage may be determined by performing a test operation on embodiments of the inventive concept for at least some of the MTJ elements of memory cells associated with the memory device.

In some embodiments, the table of FIG. 14 may be stored in a memory device, and may store one or more optimal write voltage(s) that may be used to perform write operations on a specific MTJ element(s) basis, a specific region basis, or an entire memory device basis. For example, a value of an optimal reference resistance, a value of a write voltage corresponding thereto, and/or the table may be stored in an anti-fuse array or similar nonvolatile portion of the memory device, but the scope of the inventive concept is not limited thereto.

A value of an optimal write voltage ay be determined based on a value of a write voltage actually applied to an MTJ element and a size of the MTJ element (or a reference resistance value of the MTJ element). Accordingly, the reliability of the memory device may be improved by preventing write failures due to the application of an insufficient write voltage, and memory cell endurance issues due to the application of an excessive write voltage may avoided.

Figure 15:
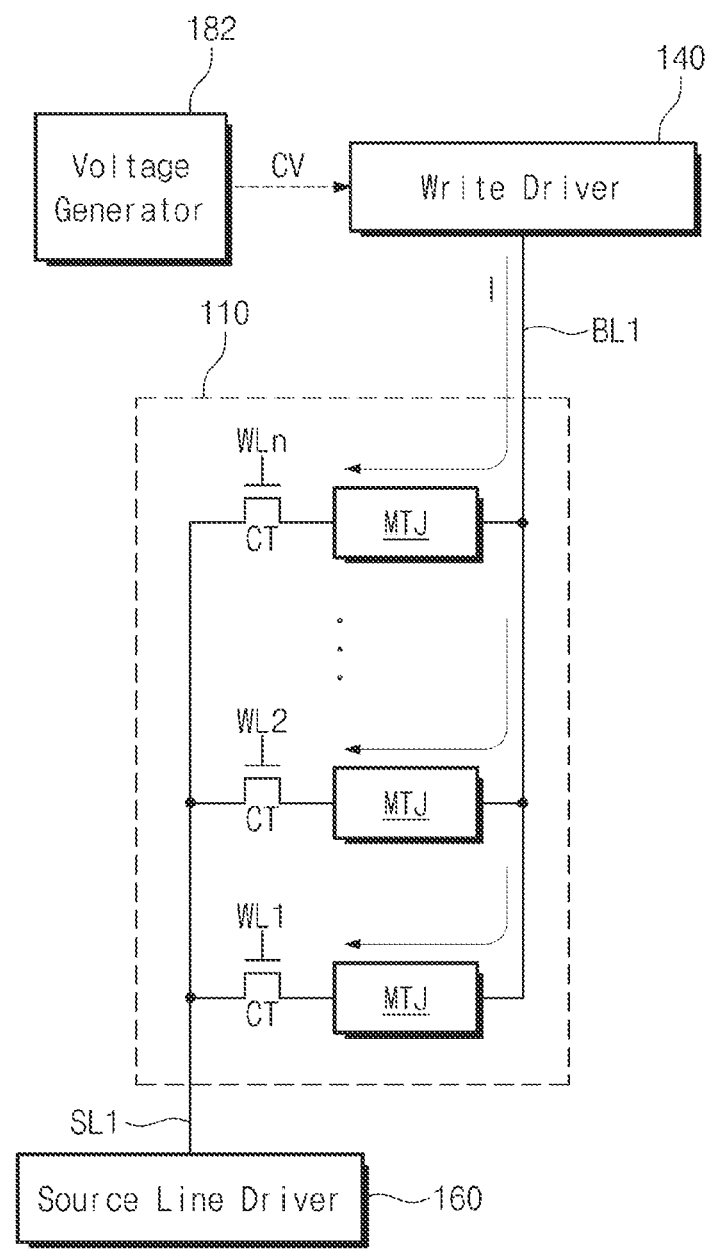
FIGS. 15, 16 and 17 are respective block diagrams illustrating approach(es) to the testing of a memory device according to embodiments of the inventive concept.
Figure 16:
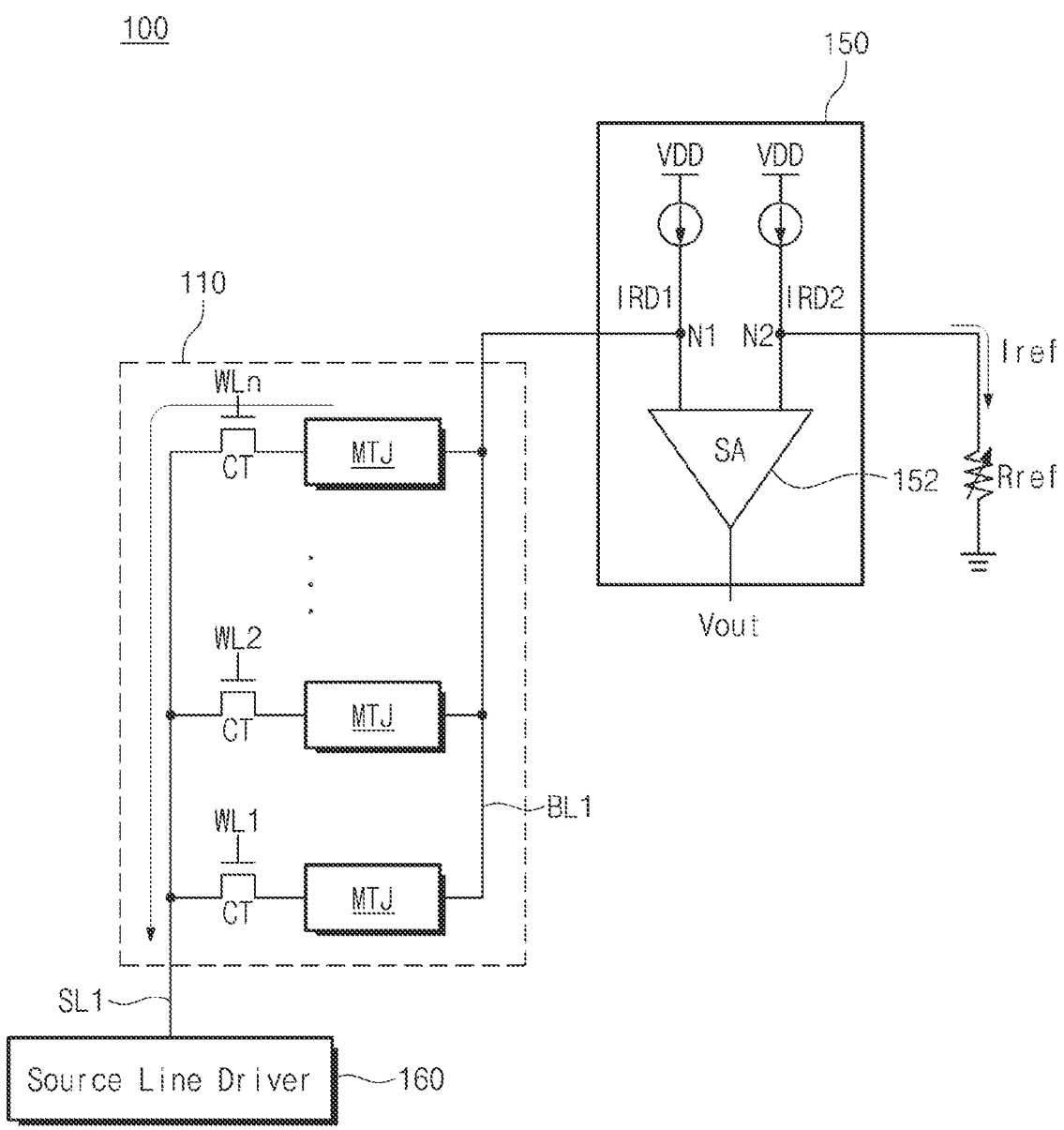
Figure 17:
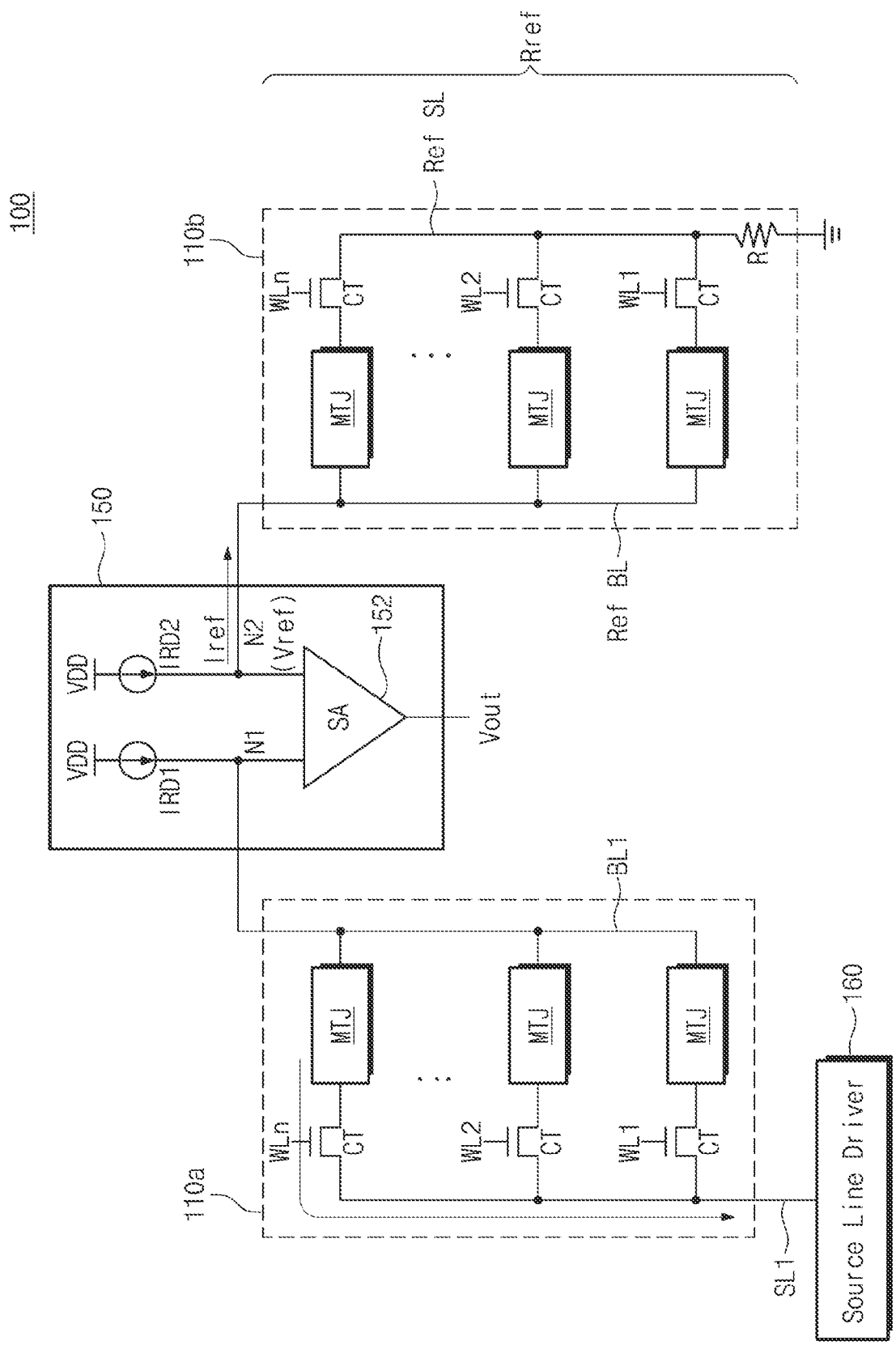

FIGS. 15, 16 and 17 are respective block diagrams illustrating a test operation for a memory device according to embodiments of the inventive concept. That is, FIGS. 15, 16 and 17 further illustrate in one example a pre-program operation that may be used during testing of the memory device 100 of FIG. 2.

Referring to FIGS. 1, 2 and 15, the memory cell array 110 is assumed to include memory cells, each including a MTJ element and a cell transistor. Here, only the write driver 140, source line driver 160 and a voltage generator 182 (e.g., part of the control logic and voltage generator 180) are shown together with an exemplary portion of the memory cell array 110. An arrangement of 1 to "n" memory cells (e.g., MRAM cells) are shown connected to the first bit line BL1 and the first source line SL1.

During the testing of the memory device, the voltage generator 182 may be configured to generate a pre-program voltage for performing the pre-program operation on the memory cell array 110. Here, it is assumed that the pre-program voltage has a level sufficiently high to preclude program failure(s). For example, the level of the pre-program voltage may be higher than a program voltage used during a normal program operation performed during user operation of an electronic device incorporating the memory device. In some embodiments, the level of the pre-program voltage may be determined by a corresponding code CV for turning ON/OFF respective elements (e.g., transistors) of the write driver 140.

Thus, the write driver 140 may perform the pre-program operation on memory cells of the memory device being tested in response to the code CV. The pre-program operation may include programming memory cells to the parallel state and programming memory cells to the anti-parallel state. For example, the write driver 140 may include one or more write drivers capable of controlling the generation and provision of a write current "I" in response to the code CV.

Referring to FIGS. 1, 2, 15 and 16 an optimal reference resistance value may be determined during the testing of the memory device 100. In some embodiments, the operation described in relation to FIG. 16 may be performed after the operation previously described in relation to FIG. 15. Here, it is assumed that the memory cells of the memory device 100 have been programmed to the parallel state, the first bit line BL1 is connected to a first node N1 in the sensing circuit 150, and the first source line SL1 is connected to the source line driver 160.

A reference resistance Rref may be associated with a reference voltage Vref necessary to read data stored in memory cells of the memory cell array 110. For example, the reference resistance Rref may be implemented with gate poly silicon necessary to form a gate electrode of a transistor (e.g., the cell transistor CT) during the fabrication of the memory device 100. In this case, a value of the reference resistance Rref may be easily changed (e.g.) by adjusting a length of the implemented gate poly silicon. Accordingly, this capability in the context of the approach described in relation to FIGS. 9, 10 and 10, allows a counting of fail bits in relation to different values of the reference resistance Rref.

The sensing circuit 150 may be configured to read data stored in a memory cell connected to the first bit line BL1. For example, the sensing circuit 150 may include current sources generating a first read current IRD1 and a second read current IRD2, and a sense amplifier 152.

The first read current IRD1 may be used to sense a voltage drop in the selected memory cell of the first bit line BL1. For example, the first read current IRD1 may be input to a word line (i.e., WL2) of the selected memory cell connected to the first bit line BL1. As a result, a voltage drop may occur at the MTJ element connected to the second word line WL2.

The second read current IRD2 may be used to determine a voltage drop in the reference resistance Rref connected to a second node N2 of the sensing circuit 150 through a reference bit line (Rref BL). For example, the second read current IRD2 may flow through the reference resistance Rref, and thus, a voltage drop may occur at the reference resistance Rref. A reference current Iref, as illustrated in FIG. 16, flows through the reference resistance Rref, but the reference current Iref may be regarded as substantially the same as the second read current IRD2.

The sense amplifier 152 may sense a voltage difference of the first node N1 and the second node N2 and may amplify the sensed voltage difference. For example, a voltage level of the first node N1 may be different from a voltage level of the second node N2. The amplified voltage difference may be output as an output voltage Vout and may be used to determine data read from the memory cell.

In some embodiments, during the testing of the memory device 100, the number of fail bits of memory cells in the memory cell array 110 may be counted whenever a value of the reference resistance Rref is changed. For example, in the case where the memory cells of the memory cell array 110 are programmed to have the parallel state, the number of fail bits according to a value of the reference resistance Rref may have the tendency corresponding to the graph G1 of FIG. 10. In the case where the memory cells of the memory cell array 110 are programmed to have the anti-parallel state, the number of fail bits according to a value of the reference resistance Rref may have the tendency corresponding to the graph G2 of FIG. 10. The test device may then derive the graph G3 from the graphs G1 and G2 of FIG. 10 and may determine an optimal reference resistance value corresponding to the fewest number of fail bits and an optimal write voltage value corresponding thereto.

Referring to FIG. 17 a determination of an optimal reference resistance value may be made during the testing of the memory device.

Here, however, the memory cell array 110 of FIG. 2 is assumed to include a first memory cell region 110a and a second memory cell region 110b, and the memory cells of the first memory cell region 110a are further assumed to be connected to the first bit line BL1 and the first source line SL1.

The second memory cell region 110b may include elements and/or components necessary to generate the reference voltage Vref used to read data stored in the memory cells of the first memory cell region 110a. For example in some embodiments, the second memory cell region 110b may include memory cells connected to a reference bit line Ref BL and a reference source line Ref SL, and exhibiting a resistance of "R".

Thus, in some embodiments, the memory cells of the first memory cell region 110a and the memory cells of the second memory cell region 110b may be substantially that same. The reference bit line Ref BL may be substantially the same as the first bit line BL1, and the reference source line Ref SL may be substantially the same as the first source line SL1. That is, the first memory cell region 110a and the second memory cell region 110b may be fabricated using the same fabricating processes. However, the resistance of the respective memory cells may vary.

The sensing circuit 150 may be configured to read data stored in a memory cells connected to the first bit line BL1. For example, the sensing circuit 150 may include current sources generating the first read current IRD1 and the second read current IRD2, and the sense amplifier 152. The sensing circuit 150 may determine a voltage drop in the selected memory cell of the first bit line BL1 by using the first read current IRD1.

In addition, the sensing circuit 150 may determine a voltage drop in a memory cell connected to the reference bit line Ref BL using the second read current IRD2. For example, the second read current IRD2 may be input to a memory cell, which is selected when the cell transistor CT is turned ON through the reference bit line Ref BL. Accordingly, a voltage drop in the second memory cell region 110b may be regarded as a voltage drop in relation to the reference resistance Rref.

According to the foregoing, is may not be necessary to perform a fail bit counting operation in the first memory cell region 110a as the reference resistance Rref is replaced using the approach described in relation to FIG. 16. Instead, fail bits in the first memory cell region 110a may be counted while a value of the reference resistance Rref is changed by appropriately controlling ON/OFF states of the cell transistors CT of the second memory cell region 110b.

In addition, even though only one reference bit line Ref BL is shown in FIG. 17 connected to the second node N2, more than one reference bit lines may be connected to the second node N2. For example, a reference bit line that is connected to memory cells having the same structure as the second memory cell region 110b shown in FIG. 17 may also connected to the second node N2.

In the various embodiments described in relation to FIGS. 16 and 17, a determined value of an optimal reference resistance may be used to further determine the value of an optimal write voltage. For example, a value of an optimal write voltage that is determined based on a value of an optimal reference resistance and a value of an initial write voltage stored in a specific region (e.g., an anti-fuse array) of the memory device 100.

Figure 18:
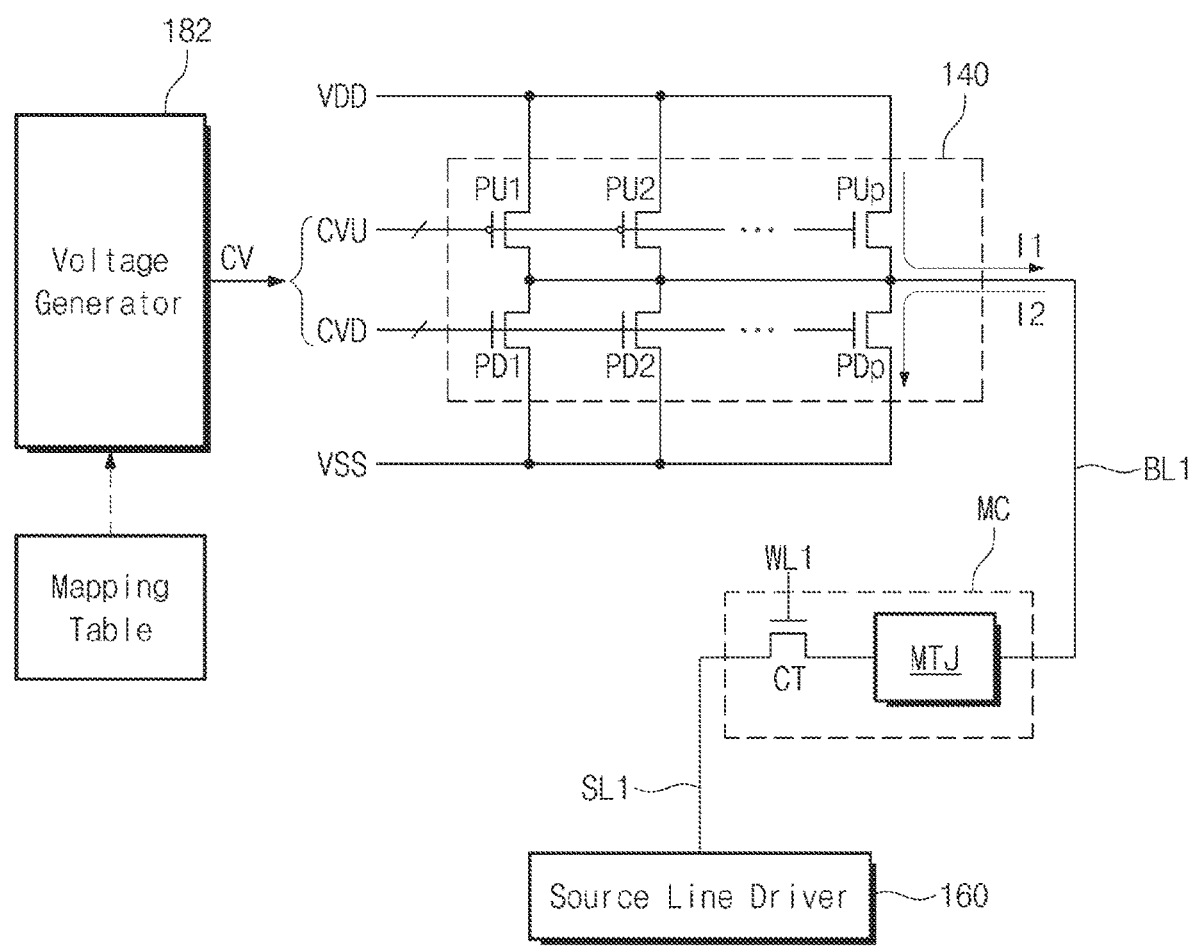
FIG. 18 is a block diagram further illustrating a possible configuration for the write driver 140 and the voltage generator 182 of FIG. 15, and FIGS. 19 and 20 are respective block diagrams further illustrating operation of the write driver 140 in response to code provided by the voltage generator 182 of FIG. 18.

FIG. 18 is a block diagram further illustrating one possible configuration for the write driver 140 of FIG. 15. That is, the write driver 140 of FIG. 18 may be used to perform a program operation using the optimal write voltage determined during testing of the memory device 100.

Referring to FIGS. 2, 15 and 18, in some embodiments, the write driver 140 may include transistors PU1 to PUp and PD1 to PDp. The transistors PU1 to PUp may be connected between the first bit line BL1 and a first power supply voltage VDD. The transistors PD1 to PDp may be connected between the first bit line BL1 and a second power supply voltage VSS. For example, a level of the first power supply voltage VDD may be higher than a level of the second power supply voltage VSS, and a level of a voltage of the source line SL1 may be between the level of the first power supply voltage VDD and the level of the second power supply voltage VSS. For example, the power supply voltages VDD and VSS may be provided from the voltage generator 182 or may be provided from a separate voltage generator.

The write driver 140 may be connected to the memory cell MC through the first bit line BL1 selected by the column decoder 130. In some embodiments, additional drivers that are implemented the same as the write driver 140 may be respectively provided for respective bit lines different from the first bit line BL1.

The voltage generator 182 may generate the code CV controlling the write driver 140. The code CV may be based on a mapping table associated with a value of a program voltage determined in advance. The code CV may include a first code CVU and a second code CVD. Here, the first code CVU and the second code CVD may be provided as a single code CV, or may be independently provided.

Each of the transistors PU1 to PUp may be turned ON/OFF based on the first code CVU. For example, in the case where each of the transistors PU1 to PUp is a p-channel metal oxide semiconductor field effect transistor (MOSFET), each of the transistors PU1 to PUp may be turned on in response to a bit of logic "0" and may be turned off in response to a bit of logic "1".

Each of the transistors PD1 to PDp may be turned ON/OFF based on the second code CVD. For example, in the case where each of the transistors PD1 to PDp is an n-channel metal oxide semiconductor field effect transistor (MOSFET), each of the transistors PD1 to PDp may be turned on in response to a bit of logic "1" and may be turned off in response to a bit of logic "0". However, the foregoing configuration of the write driver 140 is only one example which may be readily modified or changed.

ON transistors may provide a current path for a write current I1/I2. Accordingly, the transistors PU1 to PUp and the transistors PD1 to PDp may drive the write current I1/I2 based on the first code CVU and the second code CVD.

For example, in the case where one or more of the transistors PU1 to PUp are turned ON and the transistors PD1 to PDp are turned OFF, a voltage of the first bit line BL1 may be pulled up to the first power supply voltage VDD. In this case, the write current I1 may be provided from the first bit line BL1 to the first source line SL1.

In contrast, in the case where the transistors PU1 to PUp are turned OFF and one or more of the transistors PD1 to PDp are turned ON, a voltage of the first bit line BL1 may be pulled down to the second power supply voltage VSS. In this case, the write current I2 may be provided from the first source line SL1 to the first bit line BL1. A data state of the memory cell MC may depend on the write current I1/I2.

The number of transistors to be turned ON among the transistors PU1 to and PUp may vary depending on bits of the first code CVU. The number of transistors to be turned ON among the transistors PD1 to PDp may vary depending on bits of the second code CVD. Hence, the level of the write current I1/I2 may vary depending on the number of ON transistors.

As the number of ON transistors increases, the level of the write current I1/I2 may increase. The level of the write current I1/I2 may correspond to a sum of currents driven by ON transistors. In this manner, as one example, the level of the write current I1/I2 may be readily adjusted based on the first code CVU and the second code CVD.

Accordingly, the write driver 140 may be variously configured to provide write currents having different levels (or intensities). A level of the write current I1/I2 flowing through the memory cell MC may be adjusted to have one of the different levels provided by the write driver 140.

Figure 19:
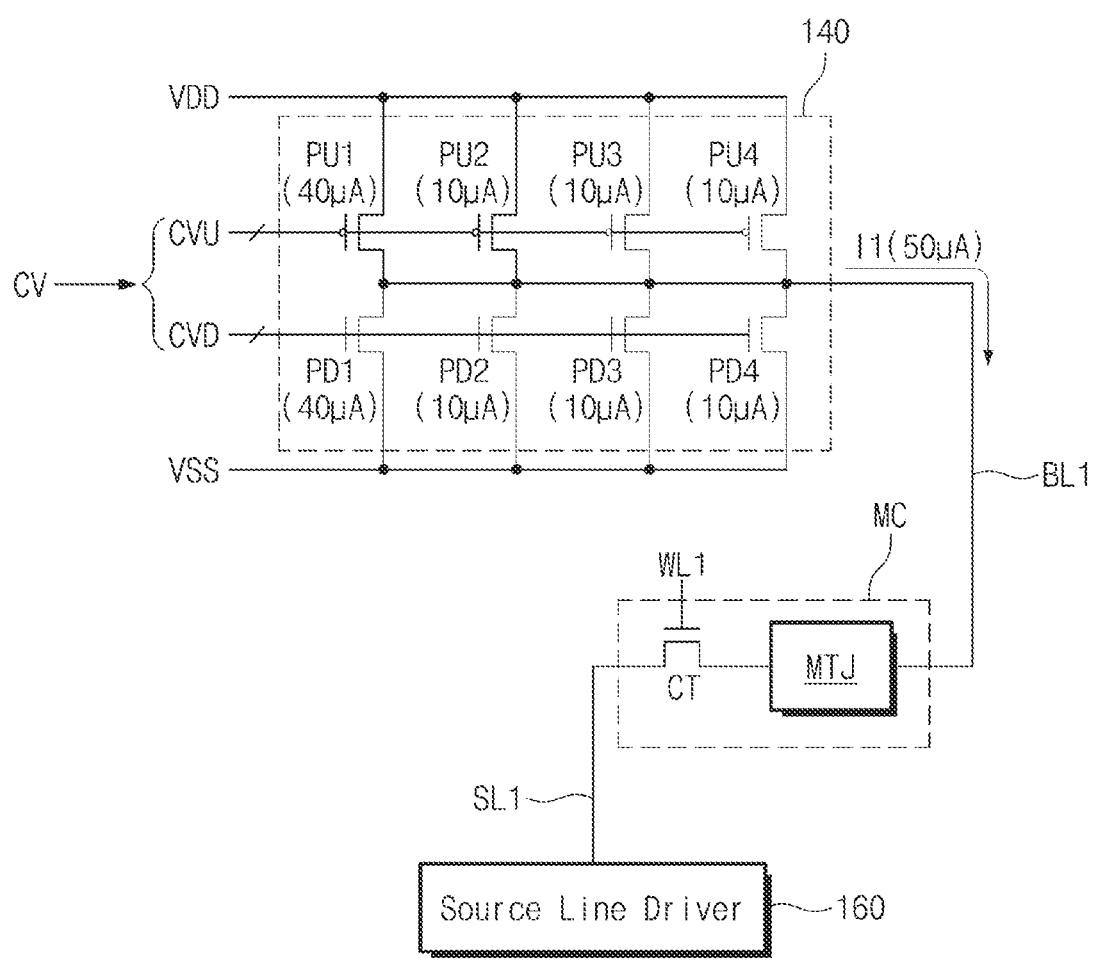
Figure 20:
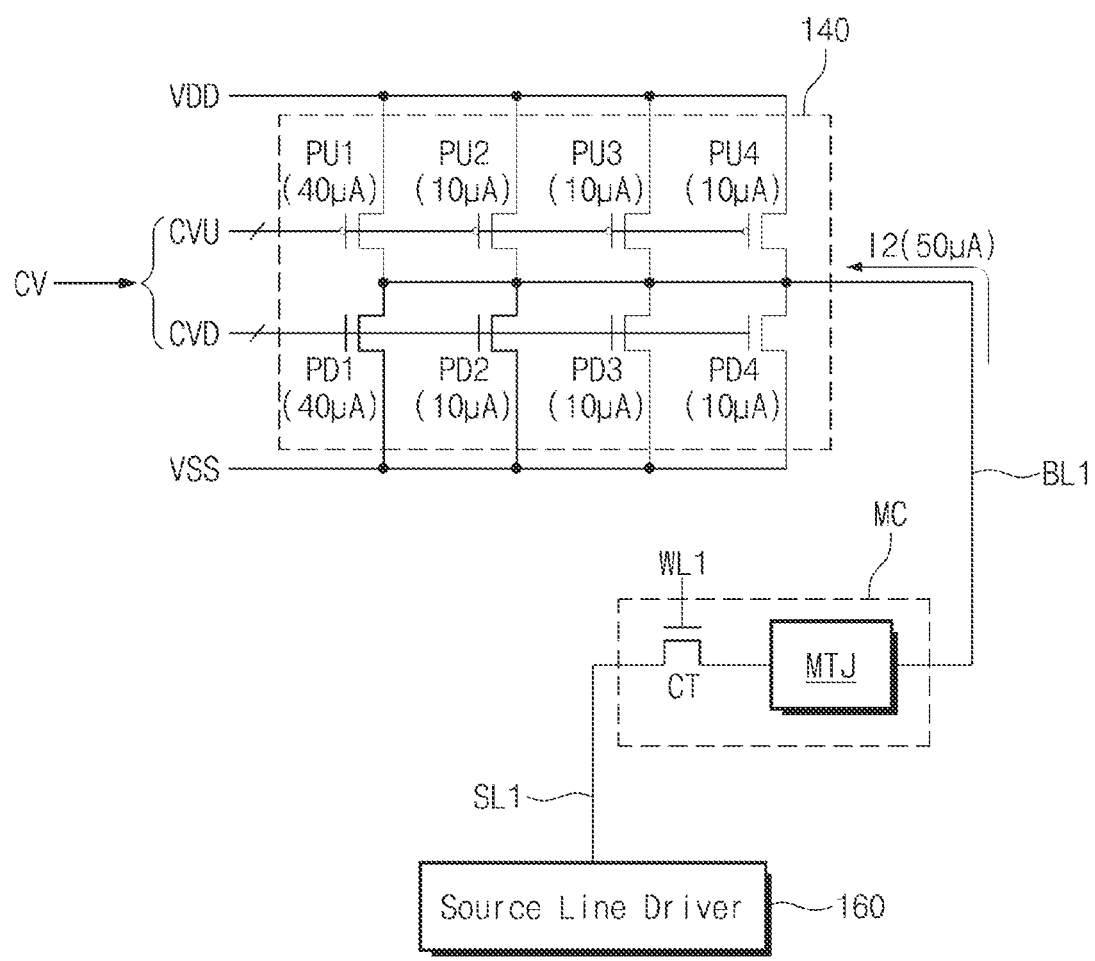

FIGS. 19 and 20 are respective block diagrams further illustrating possible operation of the write driver 140 in response to the code CV provided by the voltage generator 182 of FIG. 18.

Referring to FIGS. 2, 14, 18, 19 and 20, the write driver 140 may include transistors PU1 to PU4 and transistors PD1 to PD4. For example, each of the transistors PU1 and PD1 may have a channel width for driving a current of 40 μA, and each of the transistors PU2 to PU4 and PD2 to PD4 may have a channel width for driving a current of 10 μA.

In some embodiments, FIG. 19 may be associated with a case wherein the write driver 140 pulls up a voltage of the first bit line BL1 to the first power supply voltage VDD. In the embodiment of FIG. 19, the write driver 140 may be provided with voltages corresponding to the first code CVU of "0011" and voltages corresponding to the second code CVD of "0000" from the voltage generator 182.

Referring to FIG. 19, the transistors PD1 to PD4 may be turned OFF in response to the second code CVD. The transistors PU1 and PU2 may be turned ON in response to bits having logic "0" from among bits of the first code CVU, and the transistors PU3 and PU4 may be turned OFF in response to bits having logic "1" from among the bits of the first code CVU. Accordingly, the write current I1 of 50 μA may be driven through the ON transistors PU1 and PU2.

In some embodiments, FIG. 20 may be associated with the case where the write driver 140 pulls down a voltage of the first bit line BL1 to the second power supply voltage VSS. In the embodiment of FIG. 20, the write driver 140 may be provided with the first code CVU of "1111" and the second code CVD of "1100" from the voltage generator 182.

Referring to FIG. 20, the transistors PU1 to PU4 may be turned OFF in response to the first code CVU. The transistors PD1 and PD2 may be turned ON in response to bits having logic "1" from among bits of the second code CVD, and the transistors PD3 and PD4 may be turned OFF in response to bits having logic "0" from among the bits of the second code CVD. Accordingly, the write current I2 of 50 μA may be driven through the ON transistors PD1 and PD2.

The embodiment of FIG. 19 may be associated with a case of storing data of logic "0" in the memory cell MC, and the embodiment of FIG. 20 may be associated with the case of storing data of logic "1" in the memory cell MC. For example, to provide a code value of the mapping table illustrated in FIG. 14 to the transistors PU1 to PU4 and PD1 to PD4 constituting the driver 140, the voltage generator 182 may include components such as a switch and a multiplexer.

As described in relation to FIGS. 18, 19 and 20, the occurrence of fail bits may decrease by performing a write operation using an optimal write voltage/current determined during the testing of the memory device. As a result, the reliability of a memory device may be improved. In addition, the endurance issue described above may be avoided by not performing write operations using excessively high write voltage/current.

Figure 21:
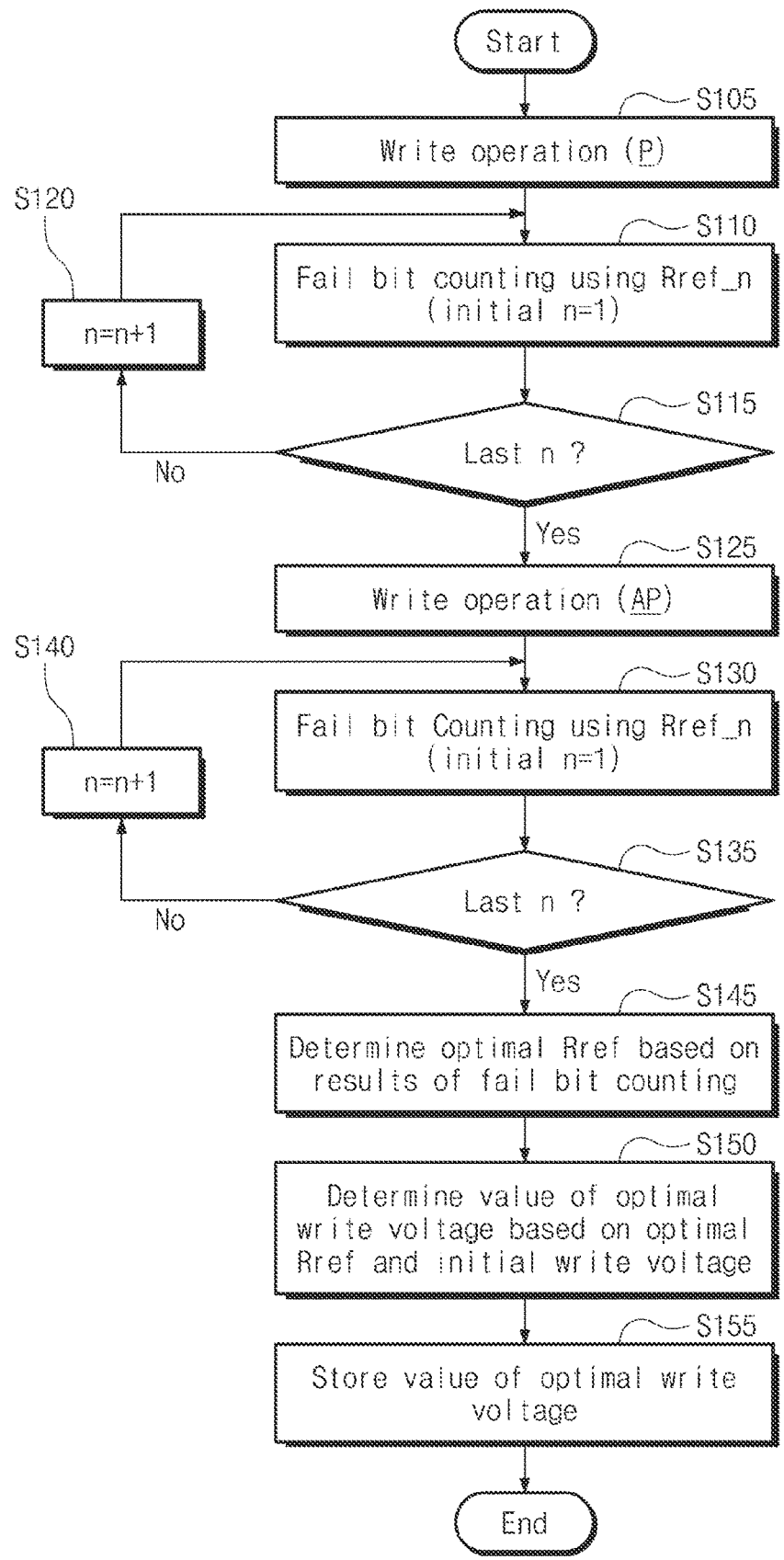
FIG. 21 is a flowchart illustrating a test method for a memory device according to embodiments of the inventive concept.

FIG. 21 is a flowchart illustrating in one example a test method for a memory device according to embodiments of the inventive concept.

A first program operation may be performed on memory cells of a memory device (S105). For example, a competent test device may program the memory cells to have the resistance distribution Rp of the parallel state (e.g., a first state) of FIG. 9.

A first fail bit counting may then be iteratively performed for the memory cells of the memory device (S110) in relation to a plurality of reference resistances Raef in order to generate a first counting result. In some embodiments, the test device may count the number of fail bits for the memory cells while incrementally varying the reference resistance Rref. For example, the expression that an initial value of the reference resistance Rref is "1" may only mean an order of a reference resistance to be used in the test operation and may not be associated with a detailed reference resistance value. That is, a value of a first-selected reference resistance Rref among the plurality of reference resistances may not be a lowest (or a highest) reference resistance, but instead (e.g.) may be a reference resistance provided by the manufacturer of the memory device.

Thereafter, the test device may count the number of fail bits of memory cells while varying the reference resistance Rref in relation to the plurality of reference resistances Rref (i.e., by repeatedly perform steps S110, S115, and S120). Once the first fail bit counting using the plurality of reference resistances is completed, the first fail bit counting result associated with the parallel state may be terminated.

Another program operation may be performed on the memory cells of the memory device (S125). For example, the test device may program the memory cells of the memory device to have the resistance distribution Rap of the anti-parallel state (e.g., a second state) of FIG. 9.

A second fail bit counting may be iteratively performed for the memory cells (S130) in order to generate a second counting result. In some embodiments, the test device may count the number of fail bits for the memory cells while varying a value of the reference resistance Rref. As in the first fail bit counting, the first-selected reference resistance Rref may be arbitrarily selected from among the plurality of reference resistance, regardless of an order of sequence of the plurality of reference resistances.

As before, the test device may count the number of second fail bits for the programmed memory cells while changing the reference resistance Rref in accordance with the plurality of reference resistances Rref (i.e., may repeatedly perform steps S130, S135, and S140). Once the second fail bit counting in relation to the plurality of reference resistances is complete and a second counting result generated, the second fail bit counting associated with the anti-parallel state may be terminated.

An optimal reference resistance value may now be determined in relation to the first counting result and the second counting result (e.g., based on the first fail bit counting and the second fail bit counting) (S145). For example, the test device may add the number of first fail bits counted in the parallel state and to the number of second fail bits counted in the anti-parallel state, respectively in relation to the plurality of reference resistances, and may then select one of the plurality of reference resistances having a lowest addition result as an optimal reference resistance.

Thereafter, an optimal write voltage/current may be determined that corresponds to the optimal reference resistance and to the initial write voltage (S150). In some embodiments, the optimal write voltage may be determined using one or more of the approaches described in relation to FIGS. 9, 10, 11, 12, 13 and 14.

Then information (e.g., a value) defining (or describing) the optimal write voltage/current may be stored in the memory device (S155). In some embodiments, the optimal reference resistance and the optimal write voltage/current may be stored in the memory device. Alternately (e.g., FIG. 14), a table may be stored in the memory device. In this case, the stored write voltage for the memory device may be used during write operations responsive to end user inputs or end user execution of an application. In some embodiments, the optimal reference resistance, the corresponding write voltage, and/or the foregoing table may be stored in an anti-fuse array (e.g., a portion of the memory cell array 110 of the memory device 100).

Figure 22:
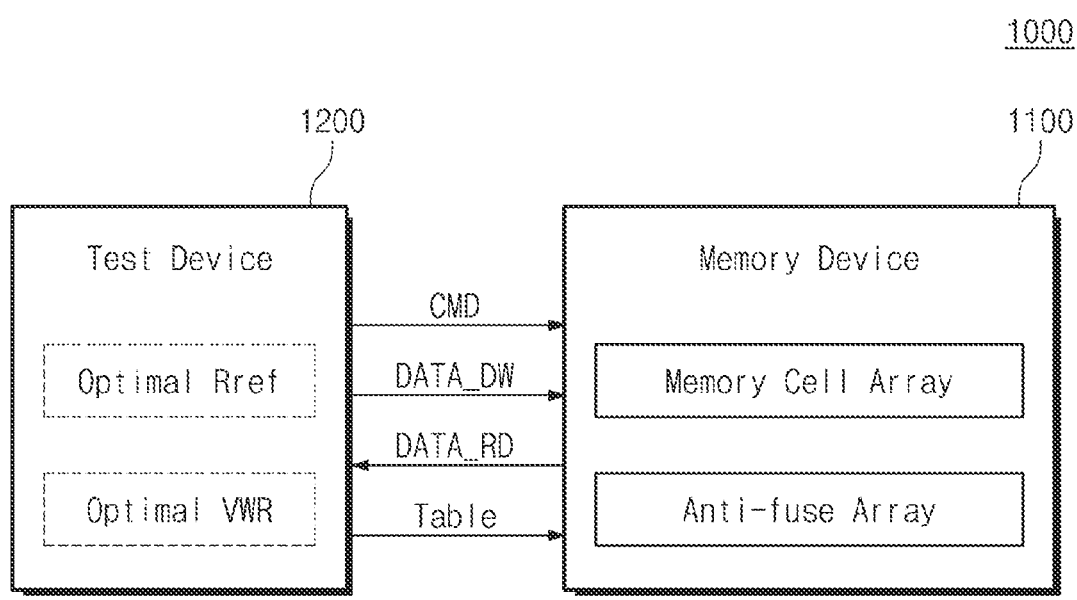
FIG. 22 is a block diagram illustrating a test system according to embodiments of the inventive concept.

FIG. 22 is a block diagram illustrating a test system according to embodiments of the inventive concept. Here, the test system 1000 may generally include a memory device 1100 and a test device 1200.

The memory device 1100 includes a memory cell array. In some embodiments, the memory device 1100 may be an implementation example of the memory device 100 described with reference to the foregoing illustrated embodiment. As noted above the memory cell array may include a first portion and a second portion, wherein the first portion is a user region designated to store user data and the second portion is a vendor region designated to store vendor provided data. In this regard, the optimal reference resistance value and optimal write voltage may be stored in the vendor portion of the memory cell array.

The test device 1200 may perform various test operations on the memory device 1100. To this end, the test device 1200 may send a command CMD to the memory device 1100.

In some embodiments, the command CMD may include a command for programming the first region of the memory cell array 1100 to a specific program state (e.g., the parallel state or the anti-parallel state). The test device 1200 may send dummy write data DATA_DW for programming the first region to the parallel state or the anti-parallel state, together with sending the command CMD.

In some embodiments, the command CMD may direct a read operation for counting the number of fail bits every reference resistance with regard to the specific program state (i.e., the parallel state or the anti-parallel state). Read data DATA_RD may be received from the memory device 1100 as a read result.

In some embodiments, the test device 1200 may count the number of fail bits every reference resistance based on the read data DATA_RD received from the memory device 1100, may determine an value of the optimal reference resistance Rref based on counting results, and may determine a value of an optimal read current (or voltage) based on the value of the optimal reference resistance Rref.

In some embodiments, the test device 1200 may store the value of the optimal reference resistance Rref and the value of the optimal write voltage (or current) in the memory device 1100 in the form of a table. For example, the table may be stored in the second region of the memory cell array 110. For example, the second region may include an anti-fuse cell array.

Certain embodiments of the inventive concept have been described in the context of a pre-program operation including (e.g.) a fail bit counting operation, an operation determining an optimal reference resistance, and an operation determining an optimal write voltage that may be performed on a memory device (e.g., semiconductor chip) by memory device basis. However, in another embodiment, an optimal write voltage value may be determined depending on a different criterion (i.e., not on a memory device or semiconductor chip basis). For example, in one memory device, because distances of memory cells from the center of a substrate are different, the memory cells may be classified according to multiple regions, and optimal write voltage(s) may be determined for each region.

According to certain embodiments of the inventive concept, an optimal reference resistance value of a memory device may be determined by performing as few as two (2) pre-program operations (i.e., respectively associated with the parallel state and the anti-parallel state) for reach memory device. A value of an optimal write voltage may be determined based on the value of the optimal reference resistance and the initial write voltage. Accordingly, a time and costs necessary to determine an optimal write voltage value may decrease. In addition, because a write operation is performed by using an optimal write voltage, the value of which is determined based on a cell characteristic of the memory device, the reliability of the memory device may be improved.

According to embodiments of the inventive concept, it may be possible to determine a value of an optimal reference resistance through the minimum number of times of a program operation for a memory device and to determine a value of an optimal write voltage based on the value of the reference resistance thus determined and a value of a write voltage actually applied to a magnetic junction element.

Accordingly, because a write operation is prevented from being performed by using an excessive write voltage, an endurance issue may be improved.

In addition, because a write operation is prevented from being performed by using an insufficient write voltage, a write failure may be prevented.

While the inventive concept has been described with reference to embodiments thereof, it will be apparent to those of ordinary skill in the art that various changes and modifications may be made thereto without departing from the spirit and scope of the inventive concept as set forth in the following claims.

What is claimed is:

1. A memory device comprising:
    a memory cell array including a first memory cell region and a second memory cell region;
    a voltage generator configured to generate a code corresponding to a write voltage; and
    a write driver configured to store data in the first memory cell region in response to the code,
    wherein the second memory cell region stores a value defining the write voltage, and
    the write voltage is determined in relation to a reference resistance distinguishing a parallel state and an anti-parallel state for the memory cells, and further in relation to an initial write voltage applied to a magnetic tunnel junction element of at least one of the memory cells.

2. The memory device of claim 1, wherein each of the memory cells includes a cell transistor including a first end connected to a source line and a gate electrode connected to a word line, and a magnetic tunneling junction element including a first end connected to a second end of the cell transistor and a second end connected to a bit line.

3. The memory device of claim 1, further comprising:
    a first current source configured to generate a first read current;
    a second current source configured to generate a second read current; and
    a sensing circuit including a sense amplifier configured to amplify a difference between a voltage drop at a first node in response to application of the first read current to a first bit line connected to a selected memory cell among the memory cells and a voltage drop at a second node in response to application of the second read current to a reference bit line.

4. The memory device of claim 3, wherein a resistance equal to the reference resistance is connected to the reference bit line.

5. The memory device of claim 4, wherein the resistance equal to the reference resistance includes gate poly silicon also forming a gate electrode of a transistor in the memory cell array.

6. The memory device of claim 3, wherein at least one memory cell having a structure the same as the selected memory cell is connected to the reference bit line.

7. The memory device of claim 1, wherein the write driver includes:
    first-type transistors respectively including a first end connected to a first power supply voltage and a second end connected to an output node; and
    second-type transistors respectively including a first end connected to a second power supply voltage and a second end connected to the output node.

8. The memory device of claim 7, wherein the code includes a first code and a second code,
    the first-type transistors respectively receive at least one bit of the first code, and
    the second-type transistors respectively receive at least one bit of the second code.

9. The memory device of claim 1, wherein the second memory cell region is an anti-fuse cell array.

10. A method of operating a memory device, the method comprising:
    programming memory cells of the memory device to a first state, and iteratively counting fail bits for the memory cells programmed to the first state using a plurality of reference resistances to generate a first counting result;
    programming the memory cells of the memory device to a second state, and iteratively counting fail bits for the memory cells programmed to the second state using the plurality of reference resistances to generate a second counting result;
    selecting one of the plurality of reference resistances as an optimal reference resistance in response to the first counting result and the second counting result; and
    determining a write voltage for the memory device in relation to the optimal reference resistance and an initial write voltage applied to a magnetic tunnel junction element of at least one of the memory cells.

11. The method of claim 10, wherein the selecting of one of the plurality of reference resistances as the optimal reference resistance includes:
    summing the first counting result and the second counting result to generate a summing result.

12. The method of claim 11, wherein the optimal reference resistance corresponds to a fewest number of fail bits in the summing results.

13. The method of claim 10, further comprising:
    storing the optimal reference resistance and the write voltage in the memory device.

14. The method of claim 13, wherein values corresponding to the optimal reference resistance and the write voltage are stored in an anti-fuse array of the memory device.

15. The method of claim 10, wherein each of the memory cells is a magnetic random access memory (MRAM) cell.

16. A memory device comprising:
    a memory cell array including a first memory cell region and a second memory cell region;
    a column decoder configured to select a bit line connected to a selected memory cell among memory cells in the first memory cell region;
    a row decoder configured to drive the bit line connected to the selected memory cell;
    a voltage generator configured to generate a code corresponding to a program voltage for the memory device; and
    a write driver configured to drive a program current storing data in the selected memory cell in response to the code, and provide the program current to the selected memory cell through the bit line,
    wherein the second memory cell region stores a value defining the program voltage and another value defining an optimal reference resistance,
    the optimal reference resistance is determined in relation to a first counting result of fail bits for memory cells in the first memory cell region programmed to a first state using a plurality of reference resistances, and a second counting result of fail bits for memory cells in the first memory cell region programmed to a second state using the plurality of reference resistances, and
    the program voltage is determined in relation to the optimal reference resistance and an initial program voltage applied to at least one of memory cells of the first memory cell region and memory cells of the second memory cell region.

17. The memory device of claim 16, wherein each of the memory cells of the first memory cell region includes; a cell transistor including a first end connected to a source line and a gate electrode connected to a word line, and a magnetic tunneling junction element including a first end connected to a second end of the cell transistor and a second end connected to a bit line.

18. The memory device of claim 16, further comprising:
a sensing circuit including:
- a first current source configured to generate a first read current;
- a second current source configured to generate a second read current; and
- a sense amplifier configured to amplify a difference between a voltage drop at a first node in response to application of the first read current to a bit line connected to the selected memory cell, and a voltage drop at a second node in response to application of the second read current to a reference bit line.

19. The memory device of claim 16, wherein the write driver includes:
- first-type transistors respectively including a first end connected to a first power supply voltage and a second end connected to an output node; and
- second-type transistors respectively including a first end connected to a second power supply voltage and a second end connected to the output node.

20. The memory device of claim 19, wherein the code includes a first code and a second code,
- the first-type transistors respectively receive at least one bit of the first code, and
- the second-type transistors respectively receive at least one bit of the second code.

* * * * *